(12) United States Patent
Pappas et al.

(10) Patent No.: US 11,257,407 B2
(45) Date of Patent: Feb. 22, 2022

(54) DISPLAY DIAGNOSTIC SYSTEM

(71) Applicant: Facebook Technologies, LLC, Menlo Park, CA (US)

(72) Inventors: Ilias Pappas, Cork (IE); Michael Yee, Kirkland, WA (US); Ramakrishna Chilukuri, San Jose, CA (US); William Thomas Blank, Bellevue, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/887,523

(22) Filed: May 29, 2020

(65) Prior Publication Data
US 2021/0335165 A1 Oct. 28, 2021

(51) Int. Cl.
*G09G 3/00* (2006.01)
*G09G 3/32* (2016.01)
*G01R 31/28* (2006.01)
*G01R 31/26* (2020.01)

(52) U.S. Cl.
CPC ......... *G09G 3/006* (2013.01); *G01R 31/2635* (2013.01); *G01R 31/2801* (2013.01); *G09G 3/32* (2013.01); *G09G 2320/0693* (2013.01)

(58) Field of Classification Search
CPC ............ G01R 31/2635; G01R 31/2801; G09G 3/006; G09G 3/32; G09G 2320/0693
See application file for complete search history.

(56) References Cited

U.S. PATENT DOCUMENTS

| | | | |
|---|---|---|---|
| 9,466,240 B2 | 10/2016 | Jaffari et al. | |
| 9,576,530 B2* | 2/2017 | Kanda | G09G 3/3233 |
| 10,565,909 B2* | 2/2020 | Xu | G09G 3/00 |
| 10,878,734 B1* | 12/2020 | Watsuda | G09G 3/006 |
| 10,964,238 B2 | 3/2021 | Pappas et al. | |
| 2010/0253706 A1 | 10/2010 | Shirouzu | |
| 2014/0329339 A1* | 11/2014 | Chaji | G01R 31/26 |
| | | | 438/10 |
| 2015/0192634 A1 | 7/2015 | Lewis et al. | |
| 2016/0225314 A1 | 8/2016 | Lee | |
| 2018/0061316 A1 | 3/2018 | Shin et al. | |
| 2018/0151112 A1 | 5/2018 | Song et al. | |

(Continued)

OTHER PUBLICATIONS

Non-Final Office Action for U.S. Appl. No. 16/261,403, dated Apr. 8, 2020, 13 pages.

(Continued)

*Primary Examiner* — Liliana Cerullo
(74) *Attorney, Agent, or Firm* — Kilpatrick Townsend & Stockton LLP

(57) ABSTRACT

In one example, an apparatus comprises a backplane to attach an array of light emitting diodes (LED), the backplane comprising an array of display driver circuits, each display driver circuit of the array of display driver circuits corresponding to an LED of the array of LEDs and comprising: a current driver circuit configured to supply to a current to the corresponding LED; a control signal generator circuit configured to supply a driver control signal to the current driver circuit to control the current; and one or more monitor circuits controllable to provide access to at least one of: the current, or an internal voltage of at least one of the current driver circuit or the control signal generator circuit.

20 Claims, 24 Drawing Sheets

(56) References Cited

U.S. PATENT DOCUMENTS

2020/0090630 A1     3/2020  Wang et al.
2020/0329536 A1*   10/2020  Chilukuri ............... H05B 45/12
2021/0158736 A1*    5/2021  Kwak .................. G09G 3/3648

OTHER PUBLICATIONS

Notice of Allowability for U.S. Appl. No. 16/261,403, dated Jan. 22, 2021, 2 pages.
International Search Report and Written Opinion corresponding to PCT/US20201/0026759 dated Aug. 25, 2021 (18 pages).

* cited by examiner

DISPLAY DIAGNOSTIC SYSTEM

CROSS-REFERENCE TO RELATED APPLICATION

This application claims priority under 35 U.S.C. § 119 to Greece Provisional Patent Application No. 20200100208, filed on Apr. 23, 2020, the contents of which is hereby incorporated by reference in its entirety for all purposes.

BACKGROUND

The disclosure relates generally to display, and more specifically to testing and diagnosis of components of a display.

Displays are ubiquitous and are a core component of wearable devices, smart phones, tablets, laptops, desktops, TVs and display systems. Common display technologies today include Light Emitting Diode (LED) displays. A display can be created by assembling an array of LED display devices, as well as control circuits to control the array of LED display devices. Each LED display device of the array can be controlled by the control circuits to output light of a target intensity to display an image. When a LED display device fails to output the target intensity, it can be due to a failure of the LED display device, a failure of the control circuit for the LED display device, or both.

SUMMARY

The present disclosure relates to display, and more specifically to testing and diagnosis of components of a display.

In some examples, an apparatus is provided. The apparatus comprises a backplane to attach an array of light emitting diodes (LED), the backplane comprising an array of display driver circuits. Each display driver circuit of the array of display driver circuits corresponds to an LED of the array of LEDs and comprises: a current driver circuit configured to supply to a current to the corresponding LED; a control signal generator circuit configured to supply a driver control signal to the current driver circuit to control the current; and one or more monitor circuits controllable to provide access to at least one of: the current, or an internal voltage of at least one of the current driver circuit or the control signal generator circuit.

In some aspects, the backplane further comprises an internal test controller configured to control the one or more monitor circuits of each display driver circuit.

In some aspects, the control signal generator circuit comprises a comparator having a comparator output node and a latch circuit coupled with the comparator output node and configured to generate the driver control signal. The one or more monitor circuits comprises a first monitor circuit coupled with the comparator output node and a second monitor circuit coupled with a feedback node of the latch circuit.

In some aspects, the control signal generator circuit further comprises a memory, a pull-up transistor, and a plurality of pull-down branches. Each of the pull-up transistor and the pull-down branches is coupled at the comparator output node. Each of the pull-down branches is coupled with a memory bit of the memory and an input value bit of a counter. The pull-up transistor is configured to couple the comparator output node with a power supply when enabled by a pre-charge (PCH) enable signal, and to de-couple the comparator output node from the power supply when disabled by a PCH disable signal. Each of the pull-down branches is configured to couple the comparator output node with a ground when enabled by a combination of the respective memory bit of the memory and the input value bit of the counter, and to de-couple the comparator output node from the ground when disabled by at least one of the respective memory bit or the input value bit.

In some aspects, the internal test controller is configured to: store a first value in the memory to disable each of the pull-down branches; transmit a sequence of the PCH enable and disable signals to, respectively, enable and disable the pull-up transistor; obtain, via the first monitor circuit, a voltage of the comparator output node when transmitting the sequence of the PCH enable and disable signals; determine whether the voltage of the comparator output node follows the sequence of the PCH enable and disable signals; and output an indication of whether the pull-up transistor operates normally based on the determination.

In some aspects, the internal test controller is configured to output a first indication that the pull-up transistor operates normally based on determining that the voltage of the comparator output node follows the sequence of the PCH enable and disable signals.

In some aspects, the internal test controller is configured to output a second indication that the comparator fails based on determining that the voltage of the comparator output node remains at a logical zero when the sequence of the PCH enable and disable signals is transmitted.

In some aspects, the internal test controller is configured to output a third indication that the pull-up transistor creates a permanent electrical open based on determining that the voltage of the comparator output node remains at a logical one when the sequence of the PCH enable and disable signals is transmitted.

In some aspects, the internal test controller is configured to: transmit a PCH enable signal to the pull-up transistor; store a second value in the memory to enable each of the plurality of pull-down branches when the each of the pull-down branches receives a matching input value bit from the counter; start the counter to supply a set of input values sequentially to the plurality of pull-down branches; obtain, via the first monitor circuit, a voltage of the comparator output node when the counter supplies the set of input values to the plurality of pull-down branches; determine, based on the voltage, whether a pull-down branch fails to pull down the comparator output node when the corresponding input value bit and the memory bit matches for the pull-down branch; and output a fourth indication of whether any one of the plurality of pull-down branches creates a permanent electrical open based on the determination.

In some aspects, the apparatus further comprises a remapping logic configured to map the memory bits of the memory and the input value bits of the counter to the plurality of pull-down branches. The remapping logic is configured, based on the fourth indication, to map a least significant memory bit of the memory and a least significant input value bit of the counter to one of the plurality of pull-down branches determined by the internal test controller as creating a permanent electrical open.

In some aspects, the internal test controller is configured to: obtain, via the second monitor circuit, a voltage of the feedback node of the latch circuit when the counter supplies the set of input values to the plurality of pull-down branches; determine whether the voltage of the feedback node changes; and output a fifth indication of whether the latch circuit operates normally based on whether the voltage of the feedback node changes.

In some aspects, the latch circuit is configured to output the driver control signal at the feedback node.

In some aspects, the current driver circuit comprises a current switch transistor a current bias transistor coupled in series at a first node. The current switch transistor is coupled between a power supply and the first node and controllable by the driver control signal to enable or disable the current. The current bias transistor is coupled between the first node and a first terminal to receive an anode of the LED and configured to control a magnitude of the current based on a bias signal. The backplane further comprises a common cathode to receive a cathode of each of the array of LEDs. The one or more monitor circuits comprises a third monitor circuit coupled between the first node and a monitor node.

In some aspects, the internal test controller is configured to: control the control signal generator circuit to transmit a first driver control signal to enable the current switch transistor; control the third monitor circuit to provide a current path to conduct the current to the monitor node; measure the current at the monitor node; and output a sixth indication of whether the current switch transistor operates normally based on the measured current.

In some aspects, the internal test controller is configured to: change the current based on modulating a voltage of the power supply; determine whether the measured current changes; and in response to determining that the measured current does not change, output the sixth indication that the current switch transistor creates a permanent electrical short.

In some aspects, the internal test controller is configured to, in response to determining no current is measured at the monitor node, output the sixth indication that the current switch transistor creates a permanent electrical open.

In some aspects, the internal test controller is configured to, when the LED of a display unit is coupled between the current bias transistor of the display unit and the common cathode: control the control signal generator circuit to transmit a first driver control signal to enable the current switch transistor; provide the bias signal to the current bias transistor; set a first voltage and a second voltage of, respectively, the power supply and the common cathode to put the LED in a forward bias state; obtain, from the third monitor circuit, a voltage of the first node; compare the voltage of the first node against a first threshold and a second threshold, the first threshold being higher than the second threshold; in response to determining that the voltage of the first node is above the first threshold, outputting the sixth indication that the LED creates a permanent electrical open; and in response to determining that the voltage of the first node is below the second threshold, outputting the sixth indication that the LED creates a permanent electrical short.

In some aspects, the third monitor circuit comprises a first transistor configured as a pass-gate and a second transistor configured as an amplifier. The first transistor is coupled between the first node and a gate of the second transistor. The second transistor is coupled between the power supply and the monitor node.

In some aspects, the backplane further comprises a first test pad, a second test pad, a third test pad, a fourth test pad, and a multiplexor circuit, the first test pad, the second test pad, the third test pad, and the fourth test pad being accessible to an external test controller. The first test pad is selectively coupled with the monitor node of the current driver circuit of a group of display driver circuits via the multiplexor circuit. The second test pad is selectively coupled with a control node of the third monitor circuit of the group of display driver circuits via the multiplexor circuit. The third test pad is selectively coupled with a gate of the current bias transistor of the group of display driver circuits via the multiplexor circuit. The fourth test pad is selectively coupled with the common cathode.

In some aspects, the external test controller is configured to, when the group of display driver circuits of the backplane is coupled with a plurality of LED devices on a wafer: connect a current source across the first test pad and the fourth test pad to inject a bias current and to provide a return path for the bias current; set first voltages at the second test pad and the third test pad to enable the third monitor circuit and the current bias transistor to transmit the bias current to the plurality of LED devices on the wafer; and set second voltages at the first test pad and the fourth test pad to set the plurality of LED devices in a forward bias state. A light emitting surface of each of the plurality of LED devices on the wafer is positioned towards a light sensor array to enable a determination of which of the plurality of LED devices fails to output light.

BRIEF DESCRIPTION OF THE DRAWINGS

Illustrative embodiments are described with reference to the following figures.

Figure 1:
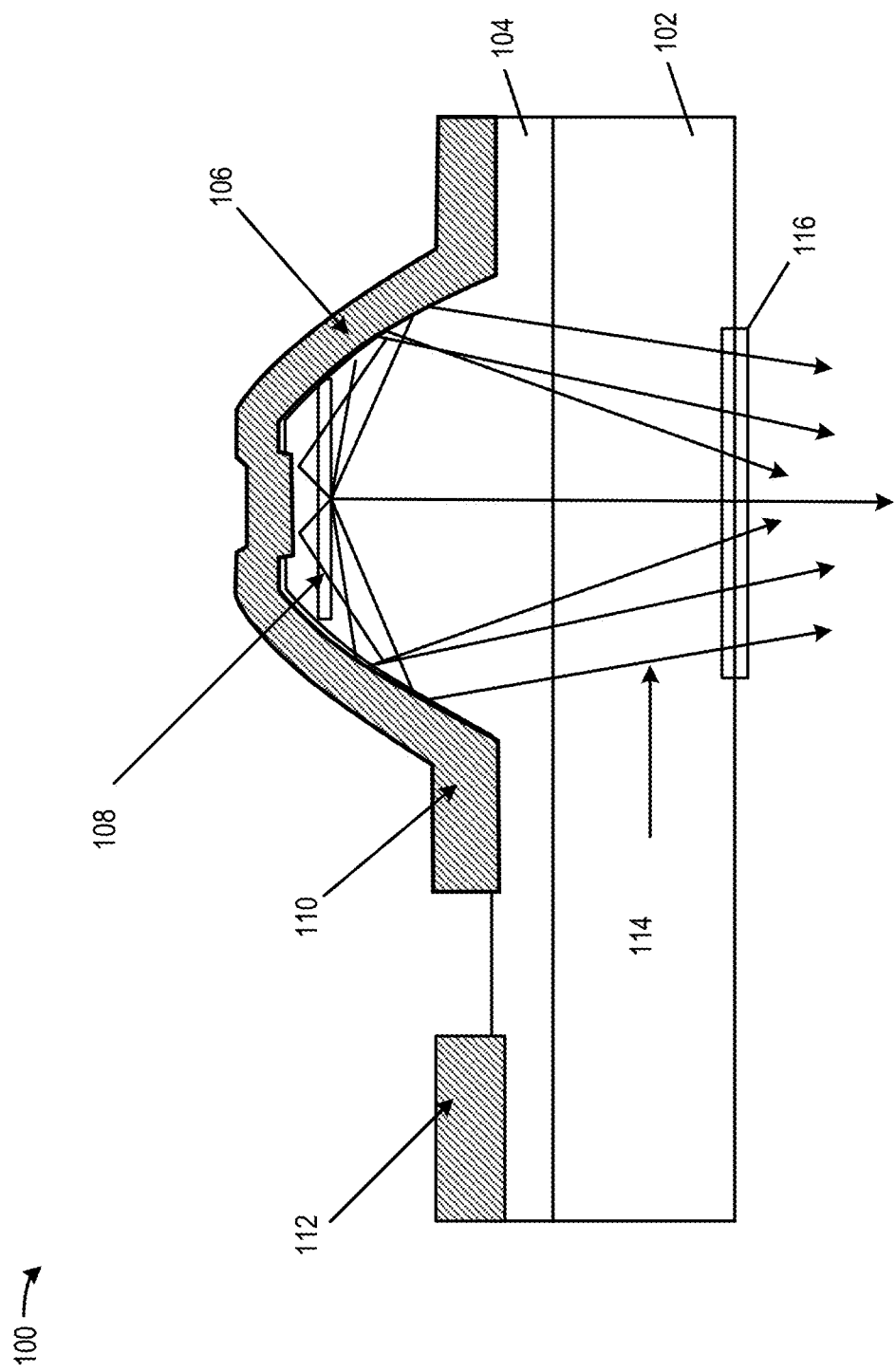
FIG. 1 shows a cross-sectional view of an example LED device that can be manufactured using examples of the disclosed techniques.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

In the following description, for the purposes of explanation, specific details are set forth in order to provide a thorough understanding of certain inventive embodiments. However, it will be apparent that various embodiments may be practiced without these specific details. The figures and description are not intended to be restrictive.

Common display technologies today range from Liquid Crystal Displays (LCDs) to more recent Organic Light Emitting Diode (OLED) displays and Active Matrix Organic Light Emitting Diode (AMOLED) displays. Inorganic Light Emitting Diodes (ILEDs) are emerging as the third generation of flat display image generators based on superior battery performance and enhanced brightness. A "µLED," "uLED," or "MicroLED," described herein refers to a particular type of ILED having a small active light emitting area (e.g., less than 2,000 µm$^2$) and, in some examples, being capable of generating directional light to increase the brightness level of light emitted from the small active light emitting area. In some examples, a micro-LED may refer to an LED that has an active light emitting area that is less than 50 µm, less than 20 µm, or less than 10 µm. In some examples, the linear dimension may be as small as 2 µm or 4 µm. In some examples, the linear dimension may be smaller than 2 µm. For the rest of the disclosure, "LED" may refer µLED, ILED, OLED, or any type of LED devices.

Examples of the present disclosure provide a display apparatus having one or more test structures. The display apparatus includes an array of light emitting diodes (LED) and a backplane on which the array of LEDs are attached. The LED can include, for example, µLED, ILED, OLED, or any type of LED devices as explained above. The backplane includes an array of display driver circuits, with each display driver circuit corresponding to an LED of array of LEDs and forming a display unit with the corresponding LED. Each display driver circuit comprises: a current driver circuit configured to supply to a current to the corresponding LED, a control signal generator circuit configured to supply a driver control signal to the current driver circuit to control the current, and one or more monitor circuits controllable to provide access to one or more internal nodes of at least one of the current driver circuit or the control signal generator circuit. The control signal generator circuit can be programmed to supply the driver control signal to the current driver circuit to set a target current for the LED, with the target current being set based on a target intensity of light to be output by the LED. In a case that display unit fails due to, for example, the LED not outputting any light, or not outputting light according to the programmed duration, etc., the one or more monitor circuits can be controlled to output, for example, voltages of internal nodes of the current driver circuit and/or the control signal generator circuit, the current that flows through the current driver circuit, etc., to enable determining which internal component(s) of the pixel causes the failure.

Specifically, the current driver circuit may include a current switch transistor and a current bias transistor connected in series, whereas the current bias transistor connects with an anode of the LED. The cathode of each LED of the display units can be coupled with a common cathode on the backplane to provide a return path to the current. The current switch transistor can be controlled by the driver control signal from the control signal generator circuit to enable or disable a current flowing through the LED driver circuit to the LED, whereas the current bias transistor can receive a bias signal (e.g., from a global current source shared by multiple pixels) to set control a magnitude of the current. The duration of enabling of the current, together with the magnitude of the current, can set an average intensity of light output by the LED.

Moreover, the control signal generator circuit comprises a comparator circuit, a latch circuit, and a memory. The memory can store a target count value representing the duration of enabling of the current through the current driver circuit. The comparator is coupled with the memory and a counter. The counter starts counting from zero but generates an input count value that is inverted from the count stored in the counter. The comparator can generate a comparator output to disable the current when the target count value represents a zero duration of enabling of the current, or when each bit of the input count value from the counter matches each corresponding bit of the target count value in the memory. The latch circuit is coupled with the comparator output and can generate the driver control signal based on the comparator output to set the duration of enabling of the current through the current driver.

In some examples, the comparator can include a pull-up transistor and a plurality of pull-down branches each coupled with a comparator output mode. The pull-up transistor is coupled between a power supply and the comparator output node, whereas each of the plurality of pull-down branches is coupled between the comparator output node and ground. The pull-up transistor can be enabled to pull comparator output node 368 to an asserted state. Each pull-down branch comprises two transistors coupled in series and can be enabled to pull the comparator output node low to output a logical zero. The pull-down can occur when both a bit of the target count value and a bit of the input count value are both one, which indicates that there is a bit mismatch between the target count value and the input count value. The latch circuit can be initialized to a first state to output a logical zero for the control signal to enable the current through the LED driver. When the comparator output is a logical zero, the latch circuit can be maintained at the first state. When none of the pull-down branches is enabled, which indicate that the input count value matches the target count value, or the target count value is all zero indicating that current is to be disabled, the pull up transistor can pull the comparator output high to output a logical one, which can cause the latch circuit to transition to a second state to output a logical one for the control signal, which can then disable the current through the LED driver.

Each display unit can include one or more monitor circuits controllable to provide access to one or more internal nodes of, for example, the current driver circuit, the control signal generator circuit, etc. The internal nodes can include, for example, a node between the current switch transistor and the current bias transistor of the current driver circuit, the comparator output node (between the pull-up transistor and the pull-down branches), a feedback node of the latch circuit, etc. Each monitor circuit can include a transistor configured as a pass-gate, which can be controlled by a test control signal to pass an internal node voltage or a current as an output. In some examples, the monitor circuit can include another transistor configured as an amplifier to amplify the output of the pass-gate, which can provide better insulation of the internal nodes and reduce leakage caused by the monitor circuits.

In some examples, the monitor circuits can interface with an internal test controller, which can be part of the backplane. As part of the test, the internal test controller can program the memory to set a target operation by the control signal generator and/or the LED driver circuit. The internal test controller can then access internal node voltages/current via the monitor circuits, and determine whether the control signal generator and the LED driver circuit pass or fail their respective test based on the internal node voltages/current.

The internal test controller can perform various unit-level tests to test the components of each display unit including the control signal generator circuit, the current driver circuit, and the LED, and generate and store the test results. In a first test for pull-up transistor of the control signal generator circuit, the internal test controller can program the memory to disable the pull-down branches of the comparator (e.g., storing all zeros). The internal test controller can then transmit a sequence of enable and disable signals to the pull-up transistor, and monitor the comparator outputs. If the comparator output stays high (logical one) or stays low (logical zero) during the first test and do not respond with the sequence of enable and disable signals, the internal test controller can indicate that the pull-up transistor fails. For example, if the comparator output stays high during the first test, the internal test controller can indicate that the pull-up transistor creates a permanent electrical short between the power supply and the comparator output node. Moreover, if the comparator output stays low during the first test, the internal test controller can indicate that the pull-up transistor creates a permanent electrical open between the power supply and the comparator output node, or that at least one pull-down branch creates a permanent short between the comparator output node and ground. The internal test controller can then generate and store a result of the first test. In a case where the pull-up transistor creates a permanent open or at least one pull-down branch creates a permanent short, the display unit can become not operable.

After determining that the pull-up transistor of the comparator passes the first test (or at least there is no permanent short in the pull-down branches), the internal test controller can perform a second test to test each pull-down branch. As part of the second test, the internal test controller can program the target count value to be all logical ones, start the counter to supply a set of count values to the pull-down branches, and determine whether any of the pull-down branch fails to pull down the comparator output node when the corresponding bit of the input count value is a logical one. The failure to pull down can indicate that the pull-down branch creates a permanent open between the comparator output node and ground, the target count value bit supplied to that pull-down branch is not a logical one (e.g., due to memory failure, faulty connection, etc.), or both. At the end of the second test, the internal test generator can store an indication of which of the pull-down branch fails. As to be described below, if the pull-down branches are the only failure points of the pixel while all other components of the pixel pass their respective tests, a remapping logic can be used to bypass the failed pull-down branches when generating the control signal for the LED driver of that pixel, to allow the display unit to remain operational.

After verifying that the comparator and the memory of a display unit passes both the first test and the second test, the internal test controller can then perform a third test to test the latch circuit. As part of the third test, the internal test controller can program the memory to set a duration of enabling of the current through the LED driver, start the counter, and then monitor an internal node of the latch circuit to determine whether the latch circuit switches from the initial first state (to enable the current through the LED driver) to the second state (to disable the current through the LED driver) when the input count value matches the target count value. In some examples, to reduce the duration of the third test, the internal test controller can program the memory to have the minimum duration of enabling of current (e.g., by setting the least significant bit (LSB) to one and the rest of bits to zero) for the third test. If the latch circuit fails the third test, the internal test generator can also generate and store an indication that the pixel fails due to latch circuit failure.

After verifying that the control signal generator circuit passes the first, second, and third tests, the internal test controller can then perform various unit-level tests on the current driver. The tests can be performed either when the LED is attached to the backplane and coupled between the LED driver and the common cathode, or before the LED is attached to the backplane. In a case where the LED is attached to the backplane, the internal test controller can perform a fourth test and a fifth test to individually test, respectively, the current switch transistor and the LED. In a case where the LED is not attached to the backplane, the internal test controller can just perform the fourth test to test the current switch transistor.

As part of the fourth test, the internal test controller can set voltages at the power supply and the common cathode to put the LED in a reverse bias state so that the LED does not conduct the current. The internal test controller can then program the control signal generator to enable the current through current switch transistor. As the LED is reverse-biased, the current through the current switch transistor (if any) can flow through the monitor circuit, which can then be detected and measured by the internal test controller. The internal test controller can determine that the current switch transistor creates a permanent open if no (or very little) current is detected through the monitor circuit. Moreover, the internal test controller can also vary the power supply voltage, and determine whether the current detected through the monitor circuit also varies accordingly. If the current remains static, the internal test controller can also determine that current switch transistor creates a permanent short. In both cases, the internal test controller can generate and store an indication that the pixel fails.

After verifying that the LED driver passes the fourth test, the internal test controller can perform the fifth test to test the LED. As part of the fifth test, the internal test controller can set voltages at the power supply and the common cathode to put the LED in a forward bias state to allow the LED to conduct current. The internal test controller can then program the control signal generator to enable the current through current switch transistor, and use the monitor circuit to measure a voltage of the internal node between the current switch transistor and the current bias transistor. The internal test controller can determine that the LED fails if the internal node voltage equals or is close to the power supply, which can indicate that the LED creates a permanent electrical open. The internal test controller can also determine that the LED fails if the internal node voltage equals or is close to the common cathode voltage, which can indicate that the LED creates a permanent electrical short.

In some examples, the monitor circuit of the current driver circuit can be used to bias the LEDs to support a global light-on test when the LEDs are still on the wafer. Specifically, when the LEDs are still on the wafer, some or all of the LEDs can be attached to the backplane and electrically bonded with the current driver circuits of the backplane. The backplane may also include test pads which can be selectively coupled with the monitor circuit of the monitor circuit for the LED driver circuit of each pixel, the common cathode of the LED, as well as the gate of the current bias transistor of the LED driver circuit of each pixel via a multiplexor circuit. The test pads can be shared by the LEDs of multiple pixels, such as a row of pixels, a quadrant of pixels, etc., of the wafer that are attached to the backplane. As part of the global light-on test, the pads can be supplied with bias voltages and bias current from an external test generator in an attempt to turn on all the LEDs of the wafer that are electrically bonded with the backplane. A determination can be made about whether any of the LEDs under test fails to output light (e.g., becoming a dark pixel). The test result can provide an indication of, for example, a yield of the wafer, based on which various follow up measurements can be taken. For example, if the yield of the wafer is too low, and the fabrication of the LEDs on that wafer is not yet complete, the fabrication process can be suspended. As another example, the aforementioned pixel-level test on the LEDs can be performed only on LEDs that fail the global light-on test operation to determine whether the failed LEDs create electrical shorts or electrical opens, which allows rooting causing the fabrication process and/or process parameters that lead to the LED failures.

With the disclosed techniques, a pixel-level test structure is provided to perform internal testing of different components within each pixel of a display, which allows efficient detection as well as root-causing of pixel failure. The pixel-level test structure can also support global light-on test operation of the LEDs during the fabrication process of the LEDs to provide early detection of LED failure when those LEDs are still on the wafer and before the assembly of the display. Various follow up measurements, such as adjustment of the fabrication process and various process parameters, can be taken based on the detection of failure. All these can improve the reliability of the LED displays.

Examples of the disclosure may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some examples, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) coupled with a host computer system, a standalone HMD, a mobile device or computing system, or any other hardware platform capable of providing artificial reality content to one or more viewers.

FIG. 1 shows a cross-sectional view of a μLED 100 according to some examples of the present disclosure. As shown in FIG. 1, μLED 100 includes, among others, a substrate 102, a semiconductor epitaxial layer 104 disposed on the substrate 102. Epitaxial layer 104 can be shaped into a mesa 106. An active layer 108, which can include quantum well structures configured to emit light of a pre-determined wavelength range when activated, can be included in mesa 106. Mesa 106 has a truncated top covered by a P-type contact pad 110, whereas a part of epitaxial layer 104 outside of mesa 106 may be covered by an N-type contact pad 112. An electric signal can be applied across P-type contact pad 110 and N-type contact pad 112 to activate active layer 108 to emit light 114. Moreover, mesa 106 also has a near-parabolic shape to form a reflective enclosure. The near-parabolic structure of mesa 106 can be etched directly onto the LED die during the wafer processing steps. Mesa 106 for a typical μLED can have a diameter of about 50 micrometers (μm) or less, whereas each of P-type contact pad 110 and N-type contact pad 112 may have a diameter of about 20 μm.

Light 114 emitted from active layer 108 can be reflected off the internal walls of mesa 106 toward light emitting surface 116 at an angle sufficient for the light to escape the μLED die 100 (i.e., within an angle of total internal reflection). Light 114 can form a quasi-collimated light beam as the light emerges from light emitting surface 116.

Figure 2A:
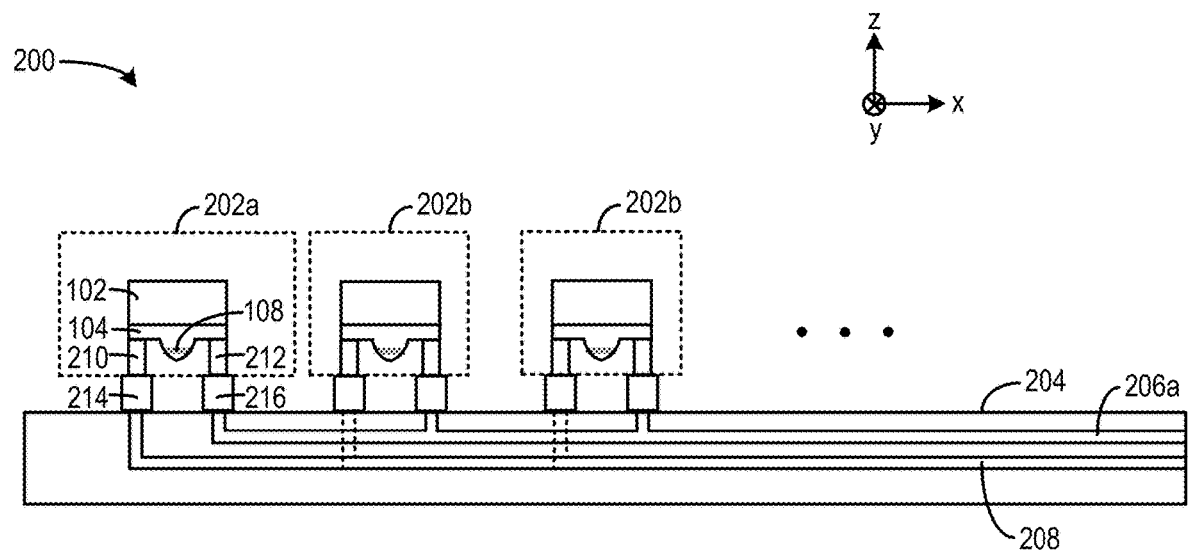
FIG. 2A, FIG. 2B, FIG. 2C, and FIG. 2D are schematic views of an example display that can be manufactured using examples of the disclosed techniques.
Figure 2B:
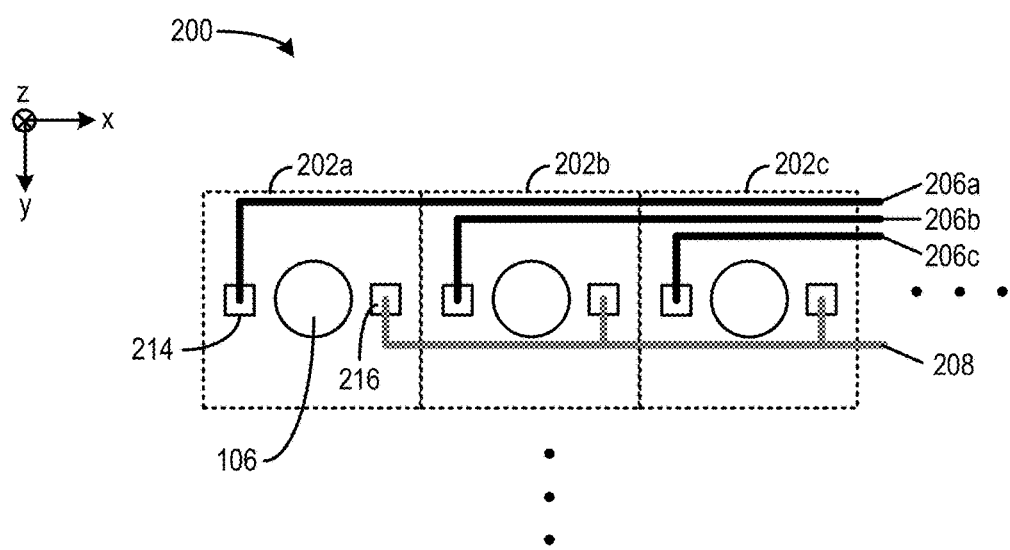

FIG. 2A and FIG. 2B show an example of a μLED display apparatus 200 according to some examples of the present disclosure. Although the examples of FIG. 2A and FIG. 2B are based on μLED devices, it is understood that the examples of FIG. 2A and FIG. 2B are applicable to other types of LED devices as well. FIG. 2A shows a cross-sectional view of the display apparatus, whereas FIG. 2B shows a top view of the display apparatus. As shown in FIG. 2A, μLED display 200 can include an array of μLED dies 202 including, for example, μLED die 202a, μLED die 202b, and μLED die 202c assembled on a backplane 204.

Backplane 204 may include a structure for attaching a plurality of μLED dies, to provide electrical connections and structural support for the plurality of μLED devices. As used herein, "backplane" may refer to any structure that provides a surface (which can be planar, curved, etc.) for attaching a plurality of LED devices (which may include μLED devices as described in this disclosure) and for providing electrical signals to the plurality of LED devices. The backplane can be configured as a display backplane to form a display device. For example, the backplane can hold assemblies of LED devices forming display elements, and the backplane may also include traces to provide electrical signals to the LED devices to control the information displayed by the display elements. Backplane 204 may comprise traces, which may connect to other components. Backplane 204 may also comprise electrical contact points, e.g., metal pads, which may provide access to the traces. For example, as shown in FIG. 2A and FIG. 2B, backplane 204 includes electrical traces 206a, 206b, and 206c to electrically connect with, respectively, μLED die 202a, μLED die 202b, and μLED die 202c. Electrical traces 206a, 206b, and 206c allow each of μLED die 202a, μLED die 202b, and μLED die 202c to be individually controlled by applying different signals. Backplane 204 also includes an electrical trace 208 to act as a return current path for each of μLED die 202a, μLED die 202b, and μLED die 202c. Backplane 204 may include different kinds of materials, such as Thin Film Transistor (TFT) glass substrate, polymer, polychlorinated biphenyl (PCB), etc. Although FIG. 2A illustrates that backplane 204 has a rectangular shape, it is understood that backplane 204 can have various shapes and sizes.

Each of μLED die 202a, μLED die 202b, and μLED die 202c can have a structure similar to μLED die 100 of FIG. 1. Each μLED die in FIG. 2A and FIG. 2B may include substrate 102, epitaxial layer 104, mesa 106, and active layer 108. In addition, each μLED die includes a device-side bump 210 and a device-side bump 212. While FIG. 2A and FIG. 2B illustrate that the bumps are of rectangular shape, it is understood that the bumps can take on other shapes including, for example, rounded shapes, dome shapes, etc. Device-side bump 210 can be connected to P-type contact pad 110 (not shown in FIG. 2A and FIG. 2B), whereas device-side bump 212 can be connected to N-type contact pad 112 (also not shown in FIG. 2A and FIG. 2B). Moreover, backplane 204 includes backplane-side bumps at each location for placing a μLED die. For example, backplane 204 includes backplane-side bumps 214 and 216 for μLED die 202a. Backplane 204 also includes metal pads (not shown in FIG. 2A) which serve as a foundation on which backplane-side bumps 214 and 216 are deposited, and to provide electrical contact to traces 206 and 208. Conductive bonding (e.g., metallic bonding) can be formed between the bumps of the μLED dies and the contacts to provide electrical paths between the μLED die and backplane 204.

Figure 2C:
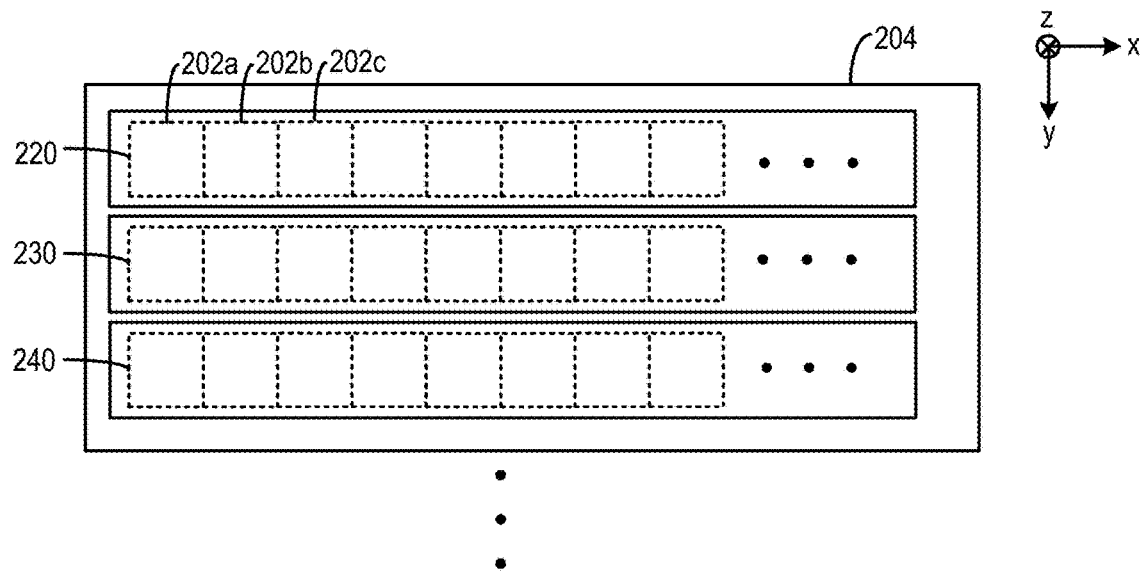
Figure 2D:
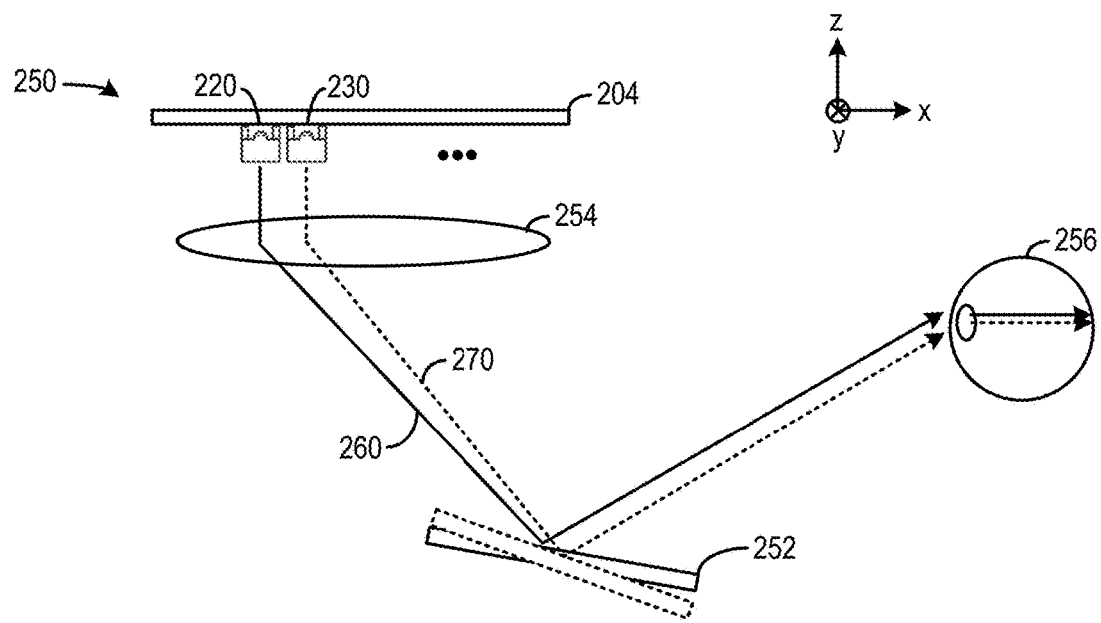

In some examples, μLED display apparatus 200 can be configured as a scanning display in which the LEDs configured to emit light of a particular color are formed as a strip (or multiple strips). For example, as shown in FIG. 2C, a plurality of μLED dies including μLED die 202a, μLED die 202b, and μLED die 202c, etc. can be assembled along an X-axis to form a μLED strip 220 configured to emit green light on backplane 204. In addition, backplane 204 also includes a μLED strip 230 configured to emit red light and an LED strip 240 configured to emit blue light.

μLED strips 220, 230, and 240, as well as additional strips of red, green and blue μLEDs, can be assembled along a Y-axis as parallel strips on backplane 204 to form a scanning display. FIG. 2D illustrates an example of a scanning display 250 comprising μLED display apparatus 200, a mirror 252, and a lens 254. In scanning display 250, each strip of LEDs can be configured to emit light of a particular color (e.g., one of red, green, or blue). For example, μLED strip 220 can emit green light 260, μLED strip 230 can emit red light 270, etc. The lights can be converged by lens 254 and reflected by mirror 252 into eyeball 256 of a person. To perform sequential scanning, each strip of μLEDs can be controlled to emit light to project a line of pixels of an image onto the retina of eyeball 256. The projection of each line of pixels can be sequential. Through the rotating action of mirror 252, each line of pixels can be projected at different points at different times on the retina, to create the perception of the image.

Figure 3A:
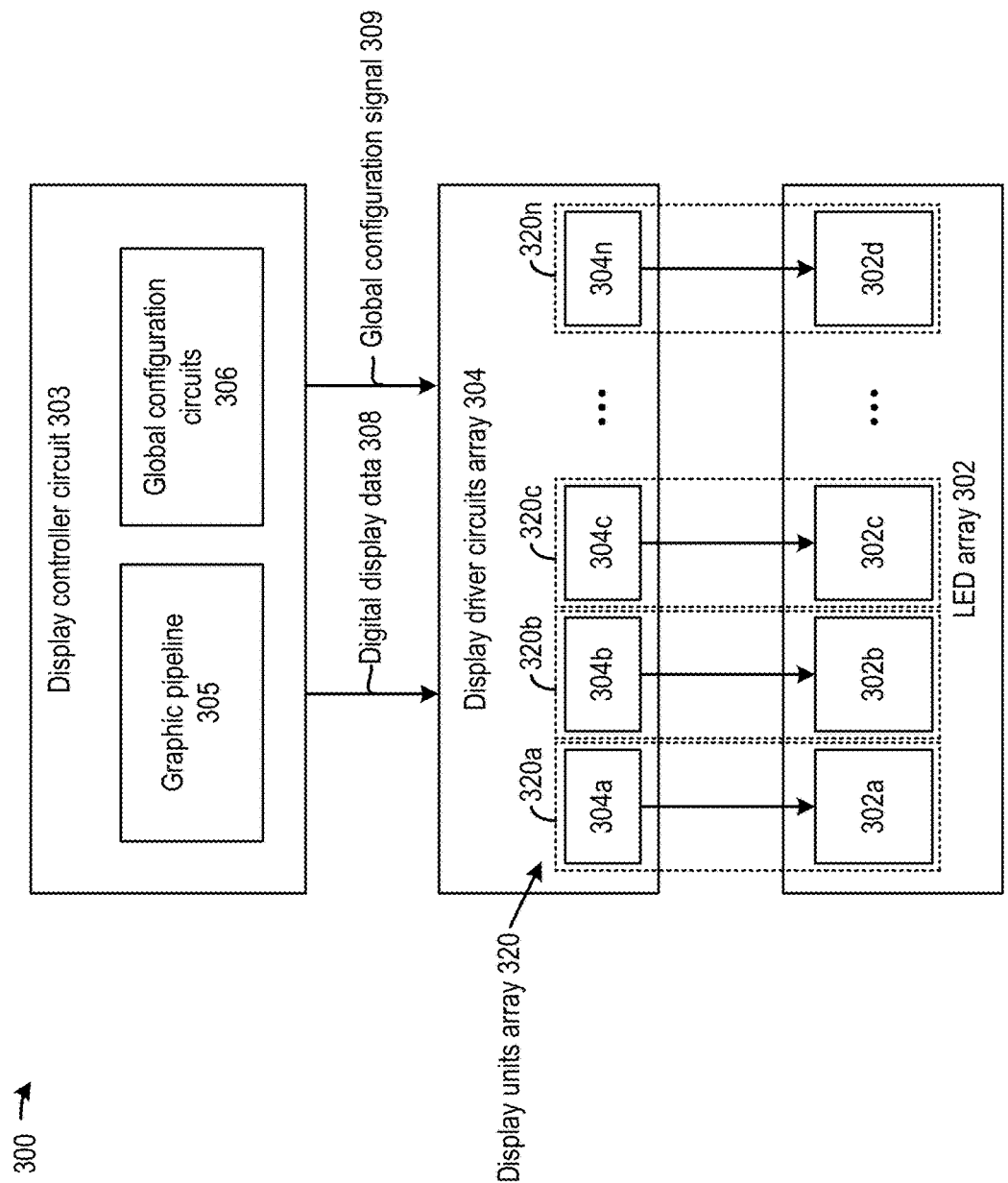
FIG. 3A, FIG. 3B, FIG. 3C, and FIG. 3D illustrate an example of a display apparatus and its operations.

FIG. 3A, FIG. 3B, FIG. 3C, and FIG. 3D illustrate examples of components of a display 300 and its operation. Display 300 can be part of scanning display 250. As shown in FIG. 3A, display 300 may include an LED array 302, a display controller circuit 303, and display driver circuit array 304. LED array 302 may include an array of individually-controllable LEDs. Each LED can be configured to output visible light of pre-determined wavelength ranges (e.g., corresponding to one of red, green, or blue) at a pre-determined intensity. In some examples, each LED can form a pixel. In some examples, a group of LEDs that output red, green, and blue lights can have their output lights combined to also form a pixel, with the color of each pixel determined based on the relative intensities of the red, green, and blue lights (or lights of other colors) output by the LEDs within the group. In such a case, each LED within a group can form a sub-pixel. Each LED of LED array 302 can be individually controlled to output light of different intensities to output an image comprising an array of pixels.

Display controller circuit 303 can include graphic pipeline 305 and global configuration circuits 306, which can generate, respectively, digital display data 308 and global configuration signal 309 to control LED array 302 (via display driver circuit array 304) to output an image. In some examples, display controller circuit 303 can be embedded in backplane 204, or can be part of an integrated circuit attached onto backplane 204 and electrically coupled with the rest of display 300 via electrical wirings (e.g., traces 206 and 208) of backplane 204.

Specifically, graphic pipeline 305 can receive instructions/data from, for example, a host device to generate digital pixel data for an image to be output by LED array 302. Graphic pipeline 305 can also map the pixels of the images to the groups of LEDs of LED array 302 and generate digital display data 308 based on the mapping and the pixel data. For example, for a pixel having a target color in the image, graphic pipeline 305 can identify the group of LEDs of LED array 302 corresponding that pixel, and generate digital display data 308 targeted at the group of LEDs. The digital display data 308 can be configured to scale a baseline output intensity of each LEDs within the group to set the relative output intensities of the LEDs within the group, such that the combined output light from the group can have the target color.

In addition, global configuration circuits 306 can control the baseline output intensity of the LEDs of LED array 302, to set the brightness of output of LED array 302. In some examples, global configuration circuits 306 can include a reference current generator as well as current mirror circuits to supply global configuration signal 309, such as a bias voltage, to set the baseline bias current supplied by each display driver circuit of display driver circuits array 304 to each LED of LED array 302.

Display driver circuit array 304 includes digital and analog circuits to control LED array 302 based on digital display data 308 and global configuration signal 309. Display driver circuit array 304 may include a display driver circuit for each LED of LED array 302. The controlling can be based on supplying a scaled baseline bias current to each LED of LED array 302, with the baseline bias current set by global configuration signal 309, while the scaling can be set by digital display data 308 for each individual LED. For example, as shown in FIG. 3A, display driver circuit 304a controls LED 302a, display driver circuit 304b controls LED 302b, display driver circuit 304c controls LED 302c, display driver circuit 304n controls LED 302n, etc. Each pair of a display driver circuit and a LED can form a display unit which can correspond to a sub-pixel (e.g., when a group of LEDs combine to form a pixel) or a pixel (e.g., when each LED forms a pixel). For example, display driver circuit 304a and LED 302a can form a display unit 320a, display driver circuit 304b and LED 302b can form a display unit 320b, display driver circuit 304c and LED 302c can form a display unit 320c, display driver circuit 304n and LED 302n can form a display unit 320n, etc., and a display units array 320 can be formed. Each display unit of display units array 320 can be individually controlled by graphic pipeline 305 and display driver configuration circuits 306 based on digital display data 308 and global configuration signal 309. In some examples, display units array 320 can be formed on backplane 204, with LED array 302 attached on backplane 204 while display driver circuit array 304 embedded within backplane 204 and electrically coupled with LED array 302 via backplane-side bumps 214 and 216 and traces 206 and 208.

Figure 3B:
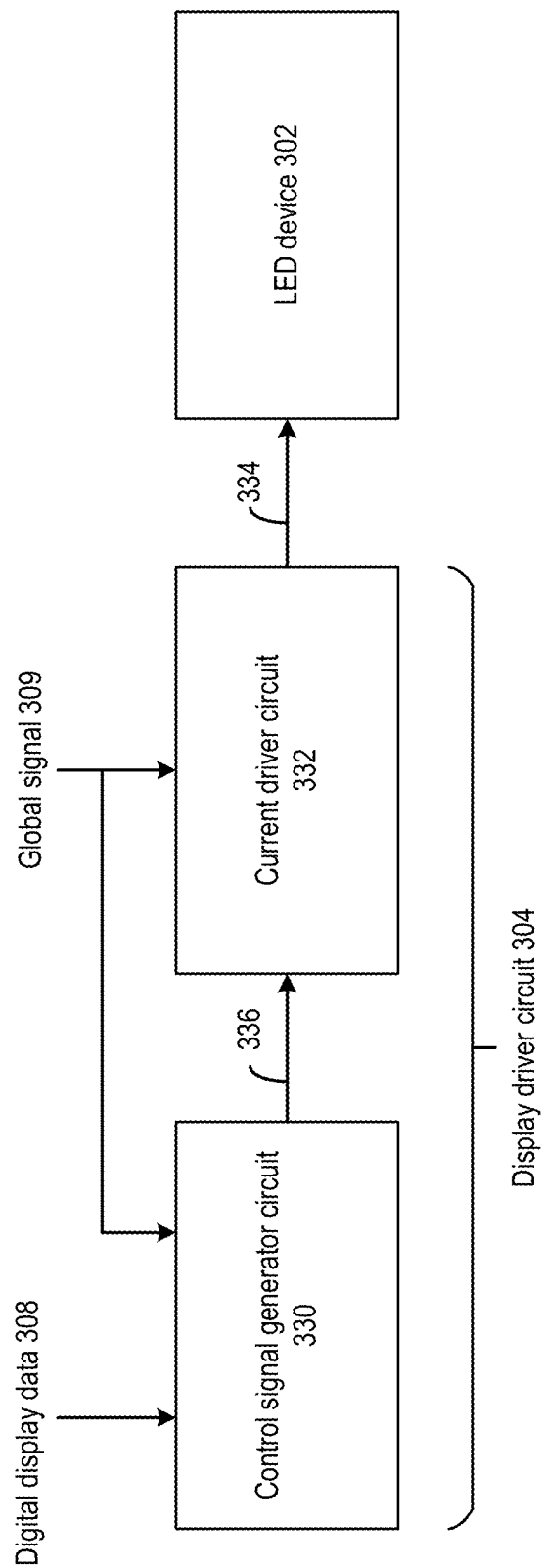

FIG. 3B illustrates an example of internal components of a display driver circuit 304, such as display driver circuit 304a. As shown in FIG. 3B, display driver circuit 304 may include a control signal generator circuit 330 and a current driver circuit 332. Current driver circuit 332 can supply a bias current 334 to an LED 302, such as LED 302a, which forms a display unit 320 with display driver circuit 304. Current driver circuit 332 can receive a bias voltage 338, which can be part of global configuration signal 309, to generate a baseline current. Moreover, control signal generator circuit 330 can generate, based on digital display data

308, a driver control signal 336 to scale the baseline current at current driver circuit 332, which can then supply the scaled baseline current to LED 302. Control signal generator circuit 330 can also receive other global configuration signal 309 to control the operations of some of its components.

In some examples, the scaling can be based on controlling a duration in which current driver circuit 332 supplies the baseline current to LED 302 within a cycle (e.g., a frame period). The average intensity of light output by LED 302 within the cycle can increase with a larger on-duration of the baseline current and decrease with a smaller on-duration of the baseline current. To perform the scaling, control signal generator circuit 330 can apply techniques such as pulse-width modulation to generate driver control signal 336 to set the on-duration of baseline current at current driver circuit 332.

Figure 3C:
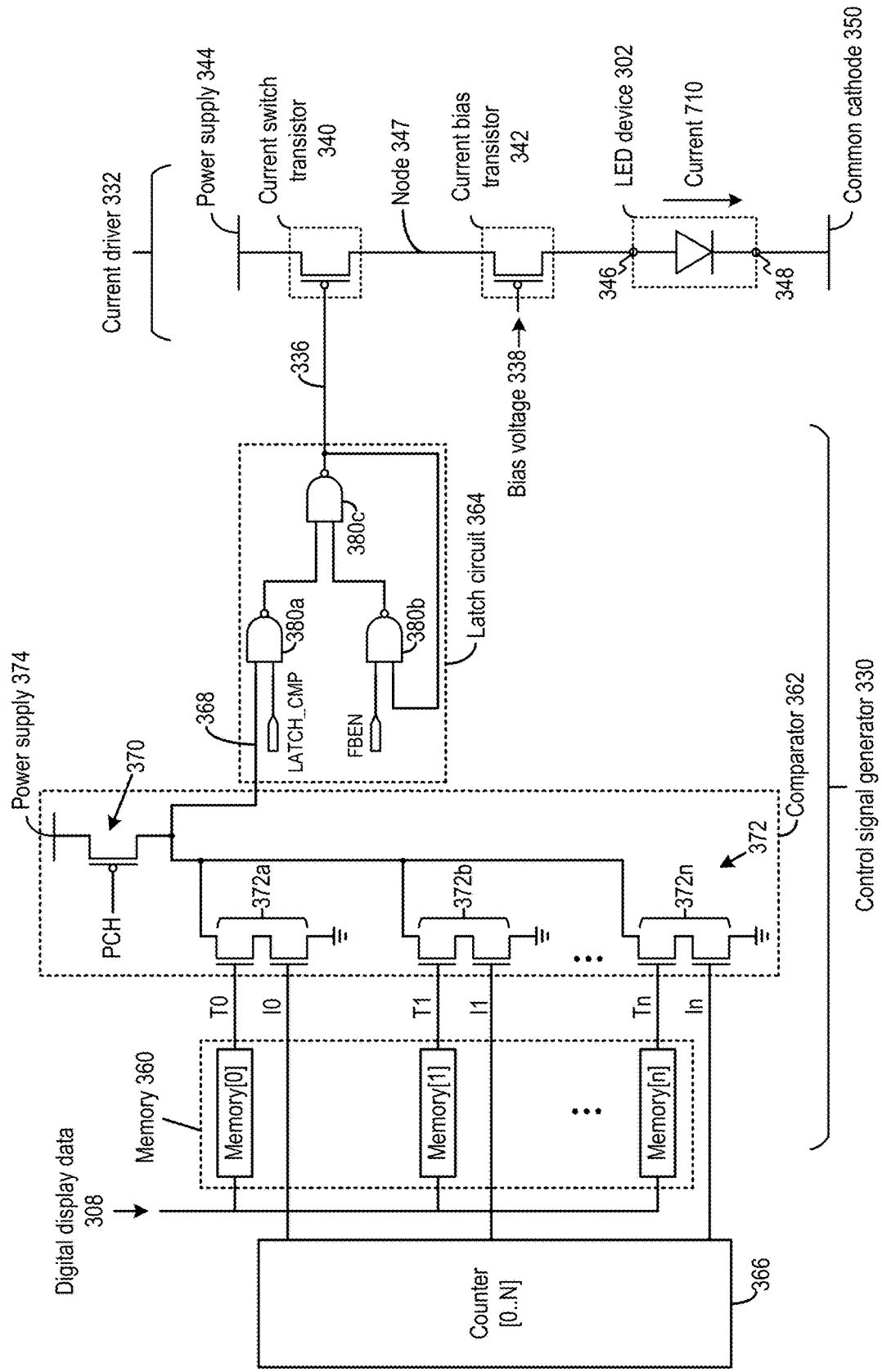

FIG. 3C illustrates example internal components of control signal generator circuit 330 and current driver circuit 332. As shown in FIG. 3C, current driver circuit 332 may include a current switch transistor 340 and a current bias transistor 342. Current switch transistor 340 can be coupled with a power supply 344 to draw bias current 334, whereas current bias transistor 342 is coupled between current switch transistor 340 (at a node 347) and LED 302 (at anode 346 of LED 302), and can set bias current 334 based on global configuration signal 309. Cathode 348 of LED 302 can be coupled with a common cathode 350 which can be trace 208 of backplane 204, to provide a return path to bias current 334.

Current switch transistor 340 can be controlled by driver control signal 336 from control signal generator circuit 330 to enable or disable the flow of bias current from current driver circuit 332 to LED 302, with the duration of enabling of the bias current set based on a target output intensity indicated in digital display data 308. As shown in FIG. 3C, control signal generator circuit 330 includes a memory 360, a comparator 362, and a latch circuit 364. Memory 360 can store a target count value (T0, T1, . . . Tn) representing the duration of enabling of the current through current driver circuit 332. The target count value can be part of digital display data 308 received from graphic pipeline 305. Memory 360 may include multiple memory bits, each of which can be a static random-access memory (SRAM) device, a latch device, a flip-flop, etc., to store different bits of the target count value and supply the bits of target count value to comparator 362.

Moreover, comparator 362 is coupled with memory 360 and a counter 366, which can be shared among a plurality of display units (e.g., being part of display controller circuit 303). Counter 366 can supply an input count value (I0, I1, . . . In) to comparator 362. The input count value can be inverted of the actual count value stored at counter 366. For example, if counter 366 has 4 bits and counts up from 0000 to 1111, input count values counts down from 1111 to 0000. Comparator 362 can generate a comparator output at comparator output node 368 to disable the current when the target count value from memory 360 represents a zero duration of enabling of the current (which means current is completely disabled during a cycle/frame period), or when each bit of the input count value from counter 366 matches each corresponding bit of the target count value in memory 360. Latch circuit 364 is coupled with the comparator output and can generate driver control signal 336 signal based on the comparator output to set the duration of enabling of the current through current driver circuit 332.

In some examples, as shown in FIG. 3C, comparator 362 can include a pull-up transistor 370 and a plurality of pull-down branches 372 (e.g., 372a, 372b, 372n, etc.) coupled with comparator output node 368. Pull-up transistor 370 is coupled between power supply 374 and comparator output node 368, whereas each of the plurality of pull-down branches 372 is coupled between comparator output node 368 and ground. Each pull-down branch corresponds to one bit of input count value (from counter 366) and one bit of target count value (from memory 360). Each pull-down branch comprises two transistors coupled in series. Pull-up transistor 370 can be controlled by a pre-charge (PCH) signal to charge up comparator output node 368 to a logical one, which can disable the current through current driver circuit 332. The PCH signal can be supplied as part of global configuration signal 309 and can be configured to reduce the pull-up strength of pull-up transistor 370 so that any one of pull-down branch 372, when enabled, can overcome pull-up transistor 370 and pull comparator output node 368 to ground to output a logical zero. Each pull-down branch can be enabled when both a bit of the target count value (e.g., T0) and a corresponding bit of the input count value (e.g., I0) are both one. As the input count value is inverted from the actual count value stored in counter 366, this corresponds to a bit mismatch between the target count value and actual count value. The duration of the bit mismatch between the target count value and the actual count value, sets the duration when comparator output node 368 is at the logical zero, which in turn can set the duration when the current is enabled in current driver circuit 332.

Latch circuit 364 can generate driver control signal 336 signal to control a duration of enabling the current through current driver circuit 332 based on the output of comparator 362. Latch circuit 364 includes logic circuits 380a, 380b, and 380c to generate driver control signal 336. In the example of FIG. 3C, each of logic circuits 380a, 380b, and 380c can include a NAND gate, although it is understood that other types of logic circuits (e.g., AND gate, NOR gate, etc.), can be included in logic circuits 380a, 380b, and 380c.

In addition, latch circuit 364 can receive a control signal LATCH_CMP and a control signal FBEN. The LATCH_CMP signal can be asserted to activate the forward path of latch circuit 364, comprising logic circuits 380a and 380c, to determine a state of latch circuit 364 based on the output of comparator 362 and to generate drive control signal 336 based on the state. The state can be maintained by a feedback path comprising logic circuits 380c and 380b, and the feedback path can be activated by the FBEN signal. The state can be changed based on the output of comparator 362 when the feedback path is disabled by de-asserting the FBEN signal. Just as the PCH signal, both the LATCH_CMP signal and FBEN signal can be provided by global configuration circuits 306 as part of global configuration signal 309.

Figure 3D:
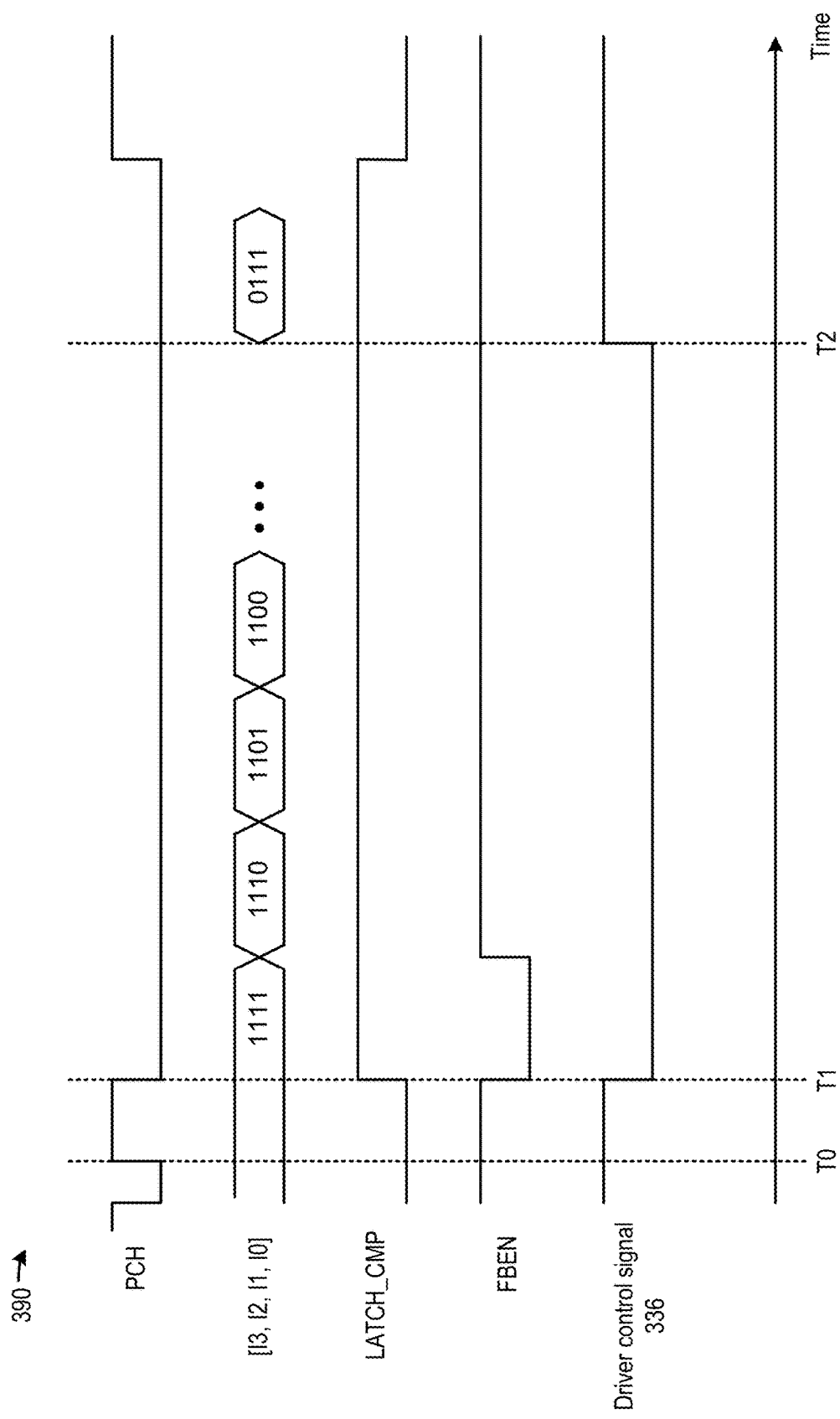

FIG. 3D illustrates an example sequence 390 of operations of control signal generator circuit 330 in generating driver control signal 336. In the example of FIG. 3D, counter 366 provides 4-bit inverted input count values starting from 1111, while the 4-bit target count value stored in memory 360 is 1000. The PCH signal is initially at the asserted state. At time T0 which can correspond to the start of a cycle/frame period, the PCH signal can be de-asserted to enable pull-up transistor 370 to pre-charge comparator output node 368, while input count value I<3:0> starts at 1111. Moreover, the LATCH_CMP signal can be de-asserted to de-activate the forward path, while FBEN is asserted to activate the feedback path, to maintain driver control signal 336 in the asserted state to disable the current through current driver circuit 332.

Between times T0 and T1, the comparison cycle starts. PCH signal can be asserted to disable pull-up transistor 370 and let any of pull-down devices 372 to pull down comparator output node 368 if any of them is enabled. Moreover, the LATCH_CMP signal can be asserted and FBEN can be de-asserted, to enable the state of latch circuit 364 to be changed. If the target count value were all zero indicating that the current through current driver circuit 332 is to be disabled throughout the whole cycle, comparator output can become a logical one between times T0 and T1 as all of pull-down branches 372 are disabled, and driver control signal 336 can be maintained in the asserted state. But in the example of FIG. 3D, the target count value is 1000. The pull-down branch 372 for MSB (bit 3) is enabled as the bit 3 of both the target count value and the input count value is one, which can pull comparator output node 368 to ground. With comparator output at a logical zero, the LATCH_CMP signal at a logical one, and the FBEN signal at a logical zero, latch circuit 364 can change driver control signal 336 to the de-asserted state to enable the current through current driver circuit 332.

In the subsequent cycles after time T1, the PCH signal remains de-asserted. The FBEN signal is asserted again to maintain the state of driver control signal 336 at the de-asserted state, so long as there is at least one pull-down branch being enabled. At time T2, input count value becomes 0111. With target count value at 1000, each bit of the input count value mismatches with each corresponding bit of the target count value. As a result, all of the pull-down branches 372 are disabled, which allows pull-up transistor 370 to charge comparator output node 368 to the asserted state. With both comparator output and the LATCH_CMP signal at a logical one, latch circuit 364 can change driver control signal 336 to the asserted state to disable the current through current driver circuit 332. The duration of enabling of the current between times T0 and T2 can represent the target count value and the target average intensity of light output by the LED during the cycle. At the end of the cycle, the PCH signal can be asserted to disable pull-up transistor 370, while input count value I<3:0> starts at 1111. Moreover, the LATCH_CMP signal can be de-asserted to de-activate the forward path, while FBEN remains asserted to activate the feedback path, to maintain driver control signal 336 in the asserted state to disable the current through current driver circuit 332.

The correct operation of a display unit 320 relies on each component of the display unit, including memory 360, comparator 362, latch circuit 364, current driver circuit 332, and LED 302 needs to function properly. When one or more of these components fails, the display unit (and the corresponding pixel) may become defective as well. For example, if one or more memory bits of memory 360 fails (e.g., an SRAM bit cell having an open or a short), comparator 362 may not receive the actual target count value, and the driver control signal 336 generated may not reflect the actual target count value. Moreover, comparator 362 may fail when any one of pull-down branches 372 creates a permanent short/open between comparator output node 368 and ground, and/or pull-up transistor 370 creates a permanent short/open between power supply 374 and comparator output node 368. In both cases, comparator output node 368 may stuck at a logical one or a logical zero regardless of the target count value and the input count value, and the display unit will become defective. Further, if there is an open or a short anywhere in latch circuit 364, latch circuit 364 can no longer control the driver control signal 336 based on the comparator output, and the display unit can become defective as well.

Finally, even if control signal generator circuit 330 operates correctly, but if current driver circuit 332 and/or LED 302 is defective, the display unit still cannot generate the correct intensity of light and will be defective.

While a pixel can become defective due to various sources of failures, it may be advantageous to root cause the exact source of failure for various reasons. First, some of the failures can be repaired/mitigated or even ignored, so that the defective pixel can still be operational. For example, one or more pull-down branches may create a permanent open (e.g., due to failure of transistors of that pull-down branch, the memory bit corresponding to that pull-down branch, etc.), while the rest of the components of the display unit operate normally. In such a case, a remapping logic can be employed to remap the bits of the target count values and input count values to bypass the open pull-down branches. In some examples, the remapping logic can be used only when there is a single memory bit failure, and the failed memory bit is mapped to the LSB. If more than one memory bit fails, the display unit/pixel can be determined to be defective and not operational. In some examples, display units array 320 may include hardware resource to perform remapping for one pixel cell within each pre-determined group of pixel cells (e.g., per row, per quadrant, etc.).

Moreover, different sources of failures in comparator 362 and in latch circuit 364 can be handled in different ways. For example, if pull-up transistor 370 creates a permanent short between comparator output node 368, but the pull-down branches 372, when enabled, can overcome pull-up transistor 370 and pull down comparator output node 368, comparator 362 may still be responsive to different target count values and input count values. Provided that the rest of the components of the display unit operate normally, the pixel can still be operational albeit with a higher power consumption, since pull-up transistor 370 and pull-down branches 372 create a current path between power supply 374 and ground even when pull-transistor 370 is supposedly disabled at the beginning of a cycle. As another example, if a particular pull-down branch creates a permanent open (while the rest of the display unit operates normally), that particular pull-down branch can be bypassed using the remapping logic, as described above, and the pixel can still be operated.

On the other hand, some other sources of failures in comparator 362 and in latch circuit 364 can render the display unit/pixel to become defective and not operational. For example, if at least one of the pull-down branches 372 create a permanent short (e.g., with both transistors of the pull-down branch creating a permanent short), and/or pull-up transistor 370 creates a permanent open, comparator output node 368 can be stuck at a logical zero. Moreover, if there is an open or a short anywhere in latch circuit 364, latch circuit 364 can no longer control the driver control signal 336 based on the comparator output, driver control signal 336 can also be stuck at a particular logic state. In both cases, the failure cannot be repaired/mitigated by the remapping logic, and the display unit/pixel can be determined to be defective and not operational.

Various sources of failures in current driver circuit 332 and LED 302 can also be handled in different ways. For example, if current switch transistor 340 creates a permanent open/short and is no longer responsive to driver control signal 336, or if LED 302 creates a permanent open/short and cannot conduct current, the display unit/pixel can be determined to be defective and not operational. On the other hand, if current flows through current driver 322 and LED 302 but does not match the expected baseline bias current, it can be due to current bias transistor 342 being defective (e.g., current source mismatch), the bias signal supplied by global configuration circuits 306 (as part of global configuration signal 309) not matching the target, or both. In these cases, the pixel may still be operational by adjusting the bias signal supplied by global configuration circuits 306.

In addition, even if the failure in the display unit/pixel cannot be repaired/recovered, it may still be advantageous to root-cause and understand the failure to improve the design and/or fabrication of the display. For example, if it is determined that the failure is due to shorts/opens in interconnects that connect the devices, further analysis can be performed to understand the causes of the interconnects shorts/opens. For example, in a case where the shorts/opens are caused by design rule violations in the physical design (layout) of the devices, improvements to the physical design can be made to address the design rule violations prior to fabrication.

Moreover, shorts and opens may appear either in the LED device or at the bonding between the LED device and pixel circuits, and in both cases, the LED device may be unable to emit light at all. Given that the electrical shorts and opens in LED devices can be caused by different reasons while both can lead to the LED device not emitting light, it can be critical to determine whether a failed LED device creates an electrical open or an electrical short, and to address the failure accordingly.

Figure 4:
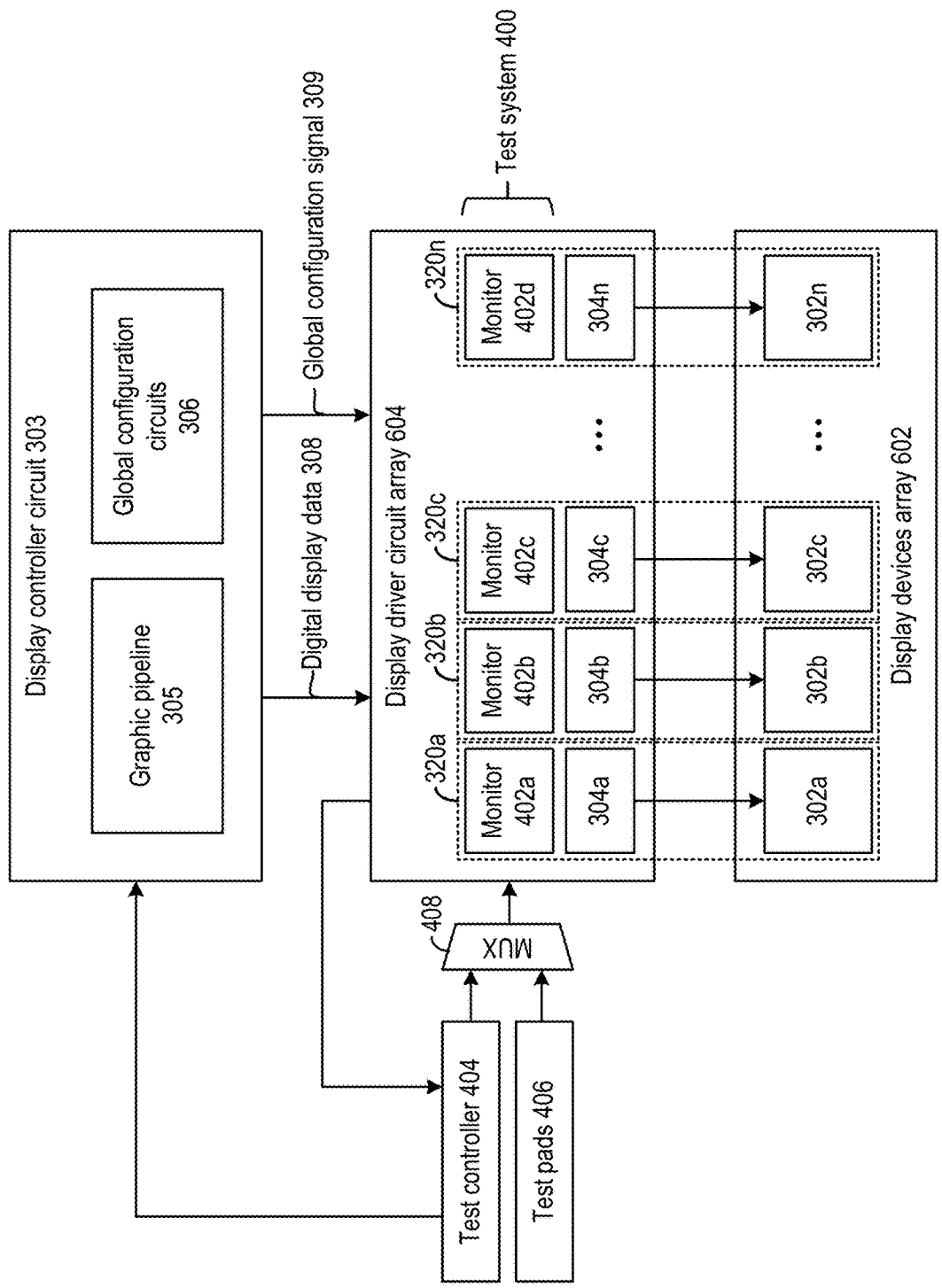
FIG. 4 illustrates examples of test circuits for the example display apparatus of FIG. 3A-FIG. 3D, according to examples of the disclosed techniques.

FIG. 4 illustrates examples of a test system 400 that can be added to display 300 to provide testing of different components within a display unit. As shown in FIG. 4, test system 400 may include a monitor system 402 in each display unit, such as monitor system 402a in display unit 320a, monitor system 402b in display unit 320b, monitor system 402c in display unit 320c, monitor system 402n in display unit 320n, etc. Each monitor system may include one or more monitor circuits controllable to provide access to one or more internal nodes of, for example, control signal generator circuit 330 and current driver circuit 332 within each display unit. Depending on a test operation, the one or more monitor circuits can be used to sense a voltage of an internal node, a current flowing a transistor device, etc. Each monitor circuit can include a transistor configured as a pass-gate, which can be controlled by a test control signal to pass an internal node voltage or a current as an output. In some examples, as to be described in detail below, the monitor circuit can include another transistor configured as an amplifier to amplify the output of the pass-gate, which can provide better insulation of the internal nodes and reduce leakage caused by the monitor circuits.

In some examples, as shown in FIG. 4, test system 400 may further include an internal test controller 404, test pads 406, and multiplexor 408. Internal test controller 404 can be embedded in backplane 204 and can configure control signal generator circuit 330 and/or current driver circuit 332 of a display unit to perform a unit-level test for each display unit. Internal test controller 404 can also control monitor system 402 of the display unit to obtain to internal node voltages and/or currents, compare the collected voltages/currents with certain thresholds to determine whether the internal components of the display unit being tested pass or fail the test, and log the test results. Internal test controller 404 can directly configure control signal generator circuit 330 and/or current driver circuit 332, or indirectly via display controller circuit 303. Internal test controller 404 can include, for example, an application specific integrated circuit (ASIC), a hardware processor that executes instructions, etc.

In addition, test pads 406 can be formed on backplane 204 and can be used to directly access current driver circuit 332 of multiple display units to support a global light-on test of multiple LEDs (e.g., LEDs) when the LEDs are still on the wafer. The test pads can be used to supply bias current/voltage from an external test generator (not shown in FIG. 4) to current driver circuit 332 and to the LED. The monitor circuit of current driver circuit 332 can also be accessed via test pads 406 to provide the bias current/voltage. Multiplexor 408 can be controlled to selectively couple internal test controller 404 or test pads 406 to monitor system 402 depending on whether a unit-level test is performed on each display unit, or a global light-on test is performed on multiple display units.

Figure 5A:
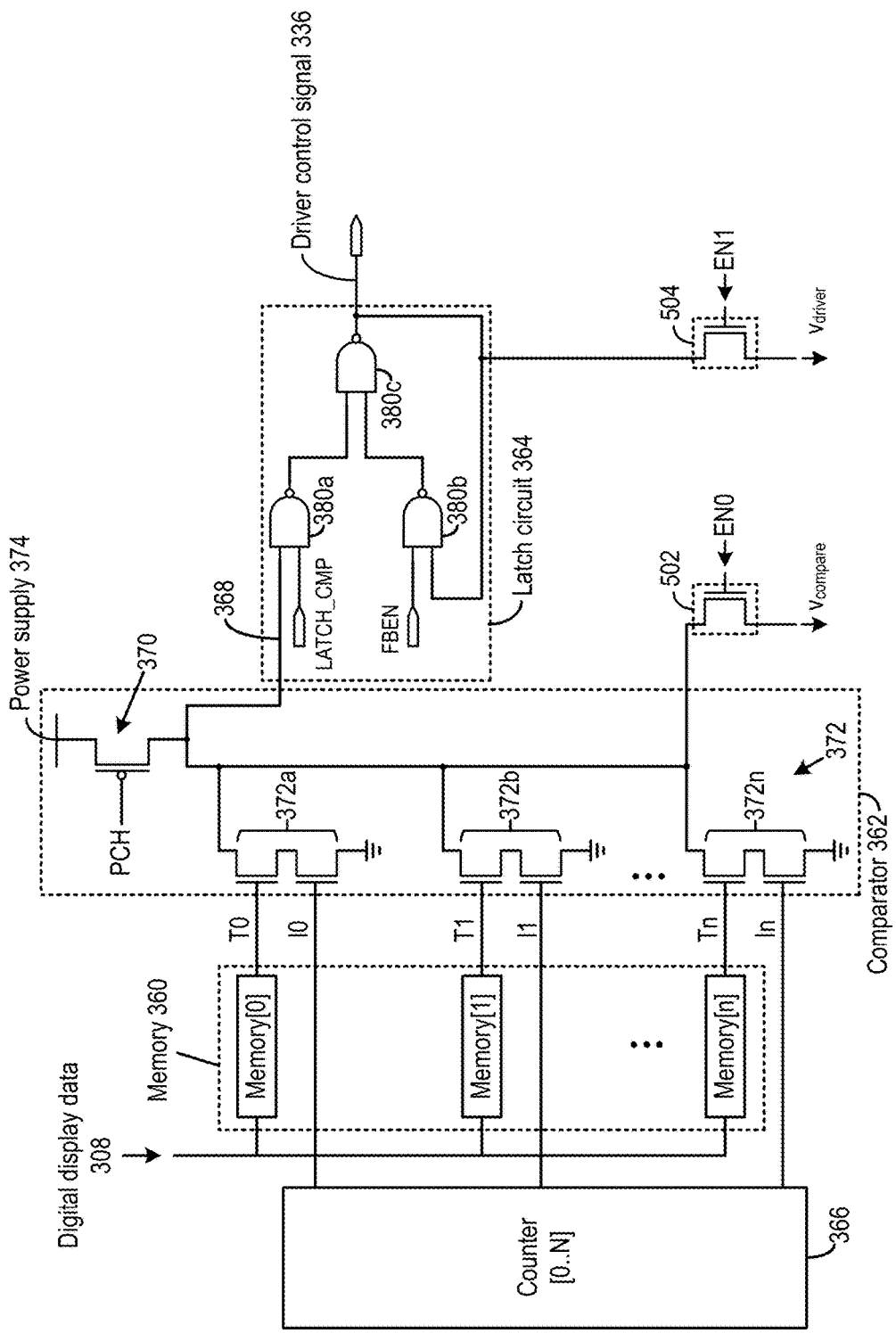
FIG. 5A, FIG. 5B, FIG. 5C, FIG. 5D, FIG. 5E, and FIG. 5F illustrate examples of test circuits for the example display apparatus of FIG. 3A-FIG. 3D and their operations, according to examples of the disclosed techniques.

FIG. 5A, FIG. 5B, FIG. 5C, FIG. 5D, FIG. 5E, and FIG. 5F illustrate example monitor circuits of control signal generator circuit 330 and various test operations supported by those monitor circuits. Referring to FIG. 5A, a monitor circuit 502, which may include a transistor configured as a pass-gate, can couple with comparator output node 608. Monitor circuit 502 can be controlled by an EN0 signal to pass a voltage of the comparator output (labelled "$v_{compare}$" in FIG. 5A). In addition, a monitor circuit 504, which may also include a transistor configured as a pass-gate, can couple with the output of latch circuit 364. Monitor circuit 504 can be controlled by an EN1 signal to pass a voltage of driver control signal 336 (labelled "$v_{driver}$" in FIG. 5A).

Figure 5B:
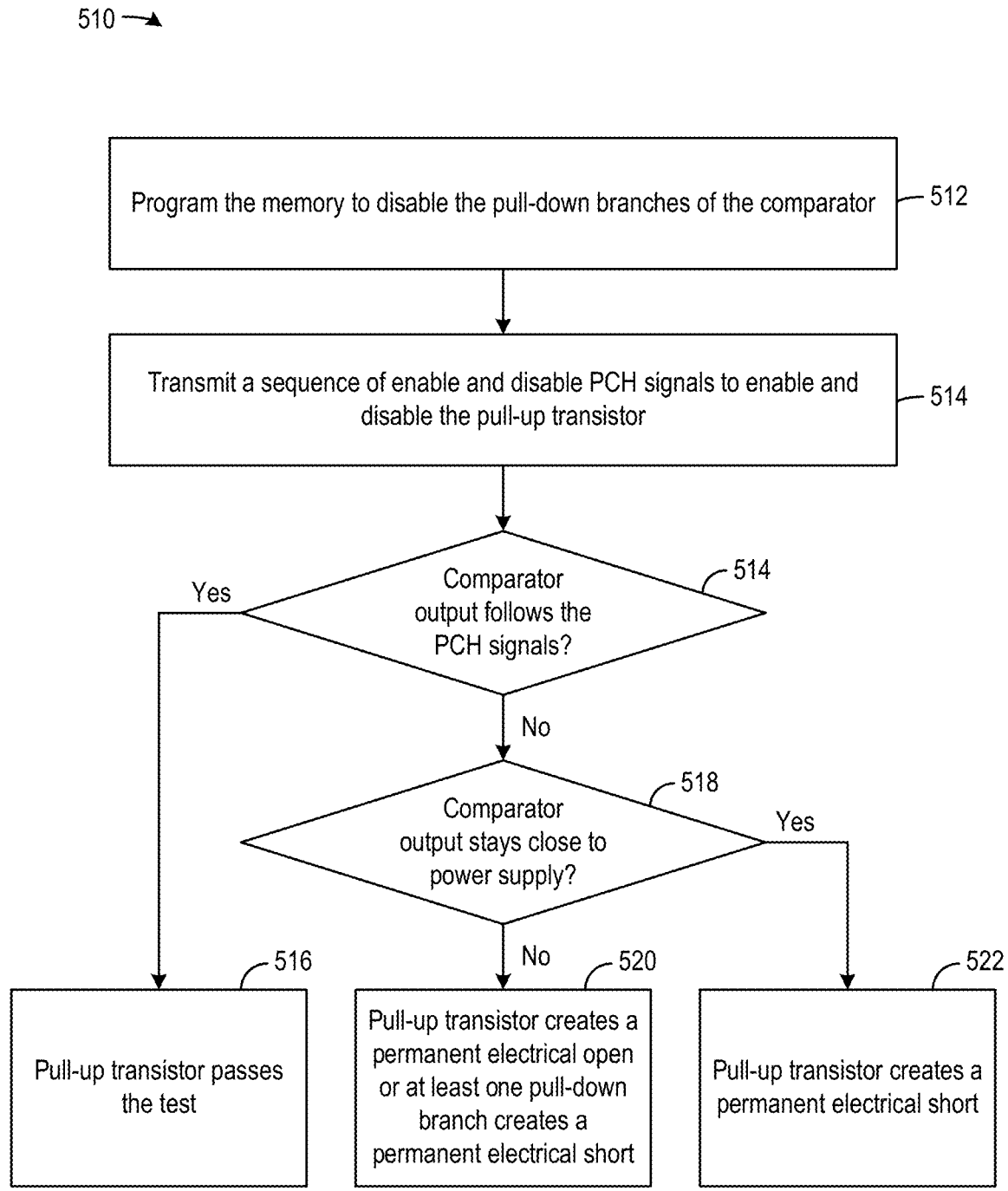

Monitor circuit 502 can be controlled by internal test controller 404 to support various unit-level tests of memory 360 and comparator 362. A sequence of test operations can be performed on pull-up transistor 370, followed by memory 360 and pull-down branches 372. FIG. 5B illustrates an example test operation 510 that can be performed using monitor circuit 502 to test pull-up transistor 370.

In step 512, internal test controller 404 can program the memory 360 to store a target count value (e.g., all zeros) to disable all pull-down branches 372.

In step 514, internal test controller 404 can transmit a sequence of enable and disable PCH signals to pull-up transistor 370, while enabling monitor circuit 502 (e.g., by asserting the EN0 signal) to sense the voltage of comparator output node 368 ($v_{compare}$ of FIG. 5A). A logical zero can be an enable PCH signal, whereas a logical one can be a disable PCH signal.

In step 516, internal test controller 404 can determine whether the voltage of comparator output node 368 follows the sequence of enable and disable PCH signals. For example, when pull-up transistor 370 receives the enable PCH signal, internal test controller 404 can compare the voltage of comparator output node 368 with a threshold voltage to determine whether pull-up transistor 370 pulls comparator output node 368 to a logical one (e.g., at or near a voltage of power supply 374). Moreover, when pull-up transistor 370 receives the disable PCH signal, internal test controller 404 can compare the voltage of comparator output node 368 with the same threshold voltage to determine whether the voltage of comparator output node 368 remains at or near the voltage of power supply 374, or whether the voltage of comparator output node 368 reduces.

If the voltage of comparator output node 368 changes with the sequence of enable and disable PCH signals, internal test controller 404 can determine that the voltage of comparator output node 368 follows the sequence of enable and disable PCH signals (step 516), and proceed to step 518 and indicate that pull-up transistor 370 passes test operation 510.

On the other hand, if internal test controller 404 determines that the voltage of comparator output node 368 does not follow the sequence of enable and disable PCH signals (step 516), internal test controller 404 can determine whether the voltage of comparator output node 368 stays near the power supply 374 (e.g., being above the threshold) throughout the test, in step 520. If the voltage of comparator output node 368 stays above the threshold throughout the test, internal test controller 404 can indicate that pull-up transistor 370 creates a permanent short, in step 522. As explained above, even if pull-up transistor 370 creates a permanent short between comparator output node 368, as long as the pull-down branches 372 can overcome pull-up transistor 370 and pull down comparator output node 368, comparator 362 may still be responsive to different target count values and input count values, and the display unit/pixel may still be operational. But the display unit/pixel may operate with higher power consumption as pull-up transistor 370 and pull-down branches 372 create a current path between power supply 374 and ground even when pull-transistor 370 is supposedly disabled at the beginning of each cycle/frame period.

On the other hand, if the voltage of comparator output node 368 stays below the threshold throughout the test, internal test controller 404 can indicate that pull-up transistor 370 creates a permanent open, and/or at least one of the pull-down branches 372 creates a permanent short despite being supposedly disabled, in step 524. As explained above, in such a case, the output of comparator 362 may be stuck at a logical zero and is no longer responsive to different target count values and input count values. As a result, the display unit/pixel can be determined to be defective and not operational.

Figure 5C:
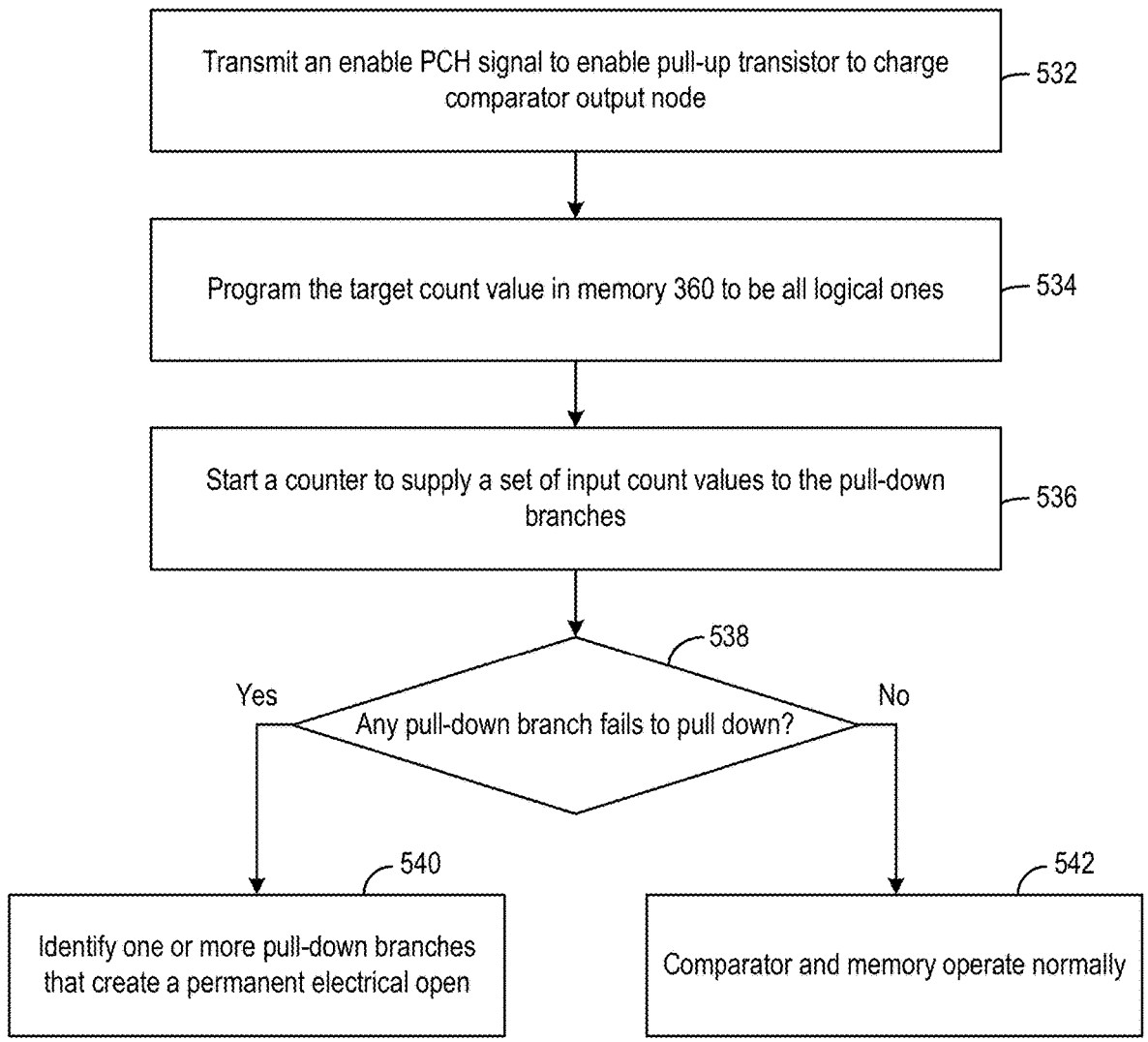

After determining that the pull-up transistor of the comparator passes the first test (or at least none of the pull-down branches creates a permanent short), the internal test controller can test memory 360 and pull-down branches 372. FIG. 5C illustrates an example test operation 530 that can be performed using monitor circuit 502 to test memory 360 and pull-down branches 372.

In step 532, internal test controller 404 can transmit an enable PCH signal (e.g., a logical zero) to enable pull-up transistor 370 to charge comparator output node 368.

In step 534, internal test controller 404 can program the target count value in memory 360 to be all logical ones.

In step 536, internal test controller 404 can start counter 366 to supply a set of input count values to the pull-down branches, while enabling monitor circuit 502 (e.g., by asserting the EN0 signal) to sense the voltage of comparator output node 368.

In step 538, internal test controller 404 can determine whether a pull-down branch 372 fails to pull down based on the voltage of comparator output node 368. For example, internal test controller 404 may determine that a particular pull-down branch is supposed to receive a logical one from both counter 366 and memory 360 at a certain time, and that particular pull-down branch is supposed to pull down the voltage of comparator output node 368.

If internal test controller 404 detects that the voltage of comparator output node 368 is not pulled down at that time, internal test controller 404 can indicate that the particular pull-down branch creates a permanent open, in step 540. This can be due to, for example, the memory bit of memory 360 corresponding to that pull-down branch fails and always supplies a logical one to that pull-down branch even when programmed with a zero, one or more transistors of that pull-down branch fails and cannot be enabled, etc.

On the other hand, if each pull-down branch 372 can pull down the voltage of comparator output node 368 when enabled by both the corresponding input count value bit and a target count value bit, internal test controller 404 can indicate that memory 360 and comparator 362 pass test operation 530, and that both can operate normally, in step 542.

Figure 5D:
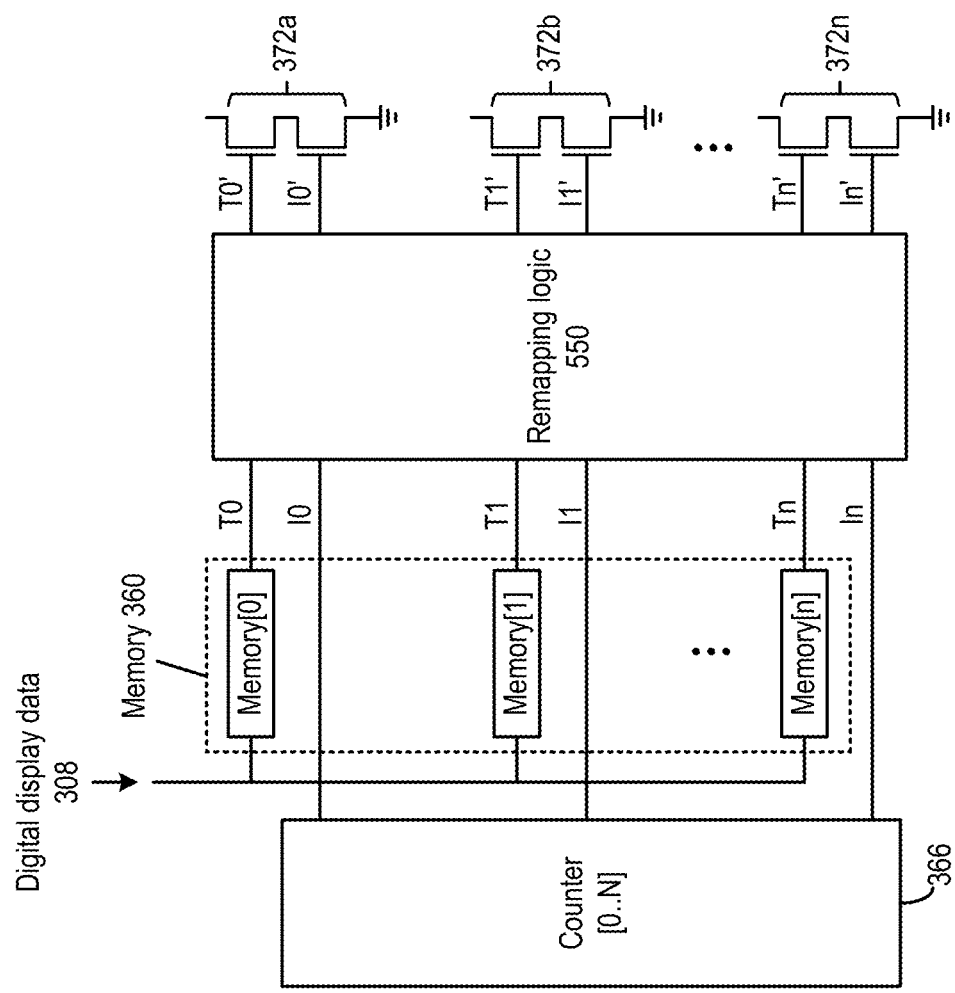
Figure 5E:
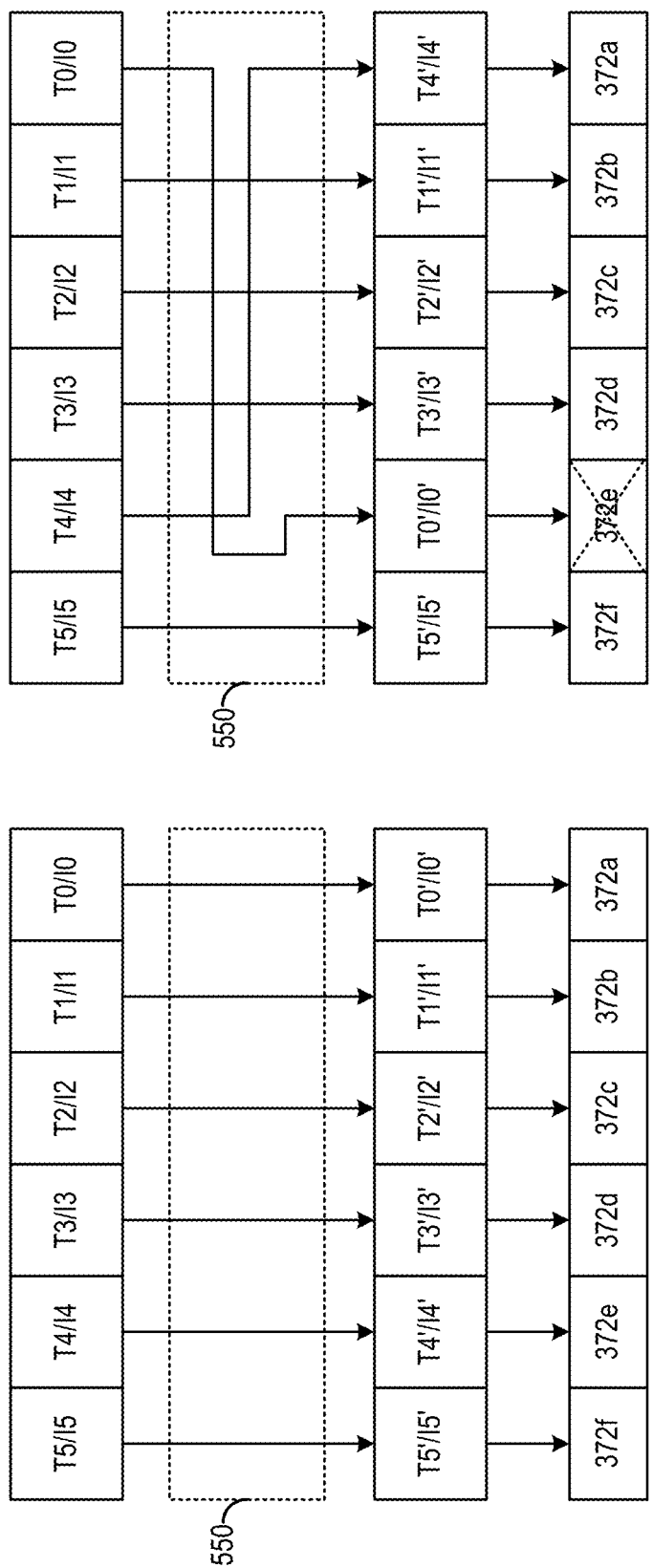

As described above, in a case where a particular pull-down branch 372 creates a permanent open (while the rest of the display unit operates normally), that particular pull-down branch can be bypassed using a remapping logic, to allow the display unit to remain operational. FIG. 5D and FIG. 5E illustrate examples of a remapping logic 550. As shown in FIG. 5D, remapping logic 550 can be interposed between memory 360/counter 366 and pull-down branches 372. Remapping logic 550 can receive the bits of a target count value T0 . . . Tn from memory 360 and route the bits as T0' . . . Tn' to pull-down branches 372. Remapping logic 550 can also receive the bits of an input count value I0 . . . In and route the bits as I0' . . . In' to pull-down branches 372. In some examples, remapping logic 550 may include a set of multiplexors which can be programmed to perform the routing operation.

FIG. 5E illustrates example routing operations of remapping logic 550, which can be programmed to route input bits to output bits to bypass certain pull-down branches. As shown on the left of FIG. 5E, remapping logic 550 can route I0/T0 as I0'/T0' to pull-down branch 372a, I1/T1 as I1'/T1' to pull-down branch 372b, I2/T2 as I2'/T2' to pull-down branch 372c, I3/T3 as I3'/T3' to pull-down branch 372d, I4/T4 as I4'/T4' to pull-down branch 372e, and I5/T5 as I5'/T5' to pull-down branch 372f.

Assuming that from test operation 510, internal test controller 404 detects that pull-down branch 372e, which used to receive the bits T4'/I4', creates a permanent open (e.g., due to memory bit failure, transistor device failure, etc.). In such a case, remapping logic 550 can be programmed to map the bits T4/I4 to pull-down branch 372a, while the LSBs T0/I0 are routed to the faulty pull-down branch 372e. With such arrangements, comparator 362, and control signal generator circuit 330, can set the duration of enabling of current in current driver circuit 332 based on the higher order bits T4/I4. On the other hand, as LSBs T0/I0 are routed to the faulty pull-down branch 372e, some resolution is lost in setting the duration (and the intensity), but the loss in resolution represented by the LSBs is much less than it would have been due to the loss of the higher order bits T4/I4. This allows the display unit to remain operational with minimum loss in intensity resolution.

Figure 5F:
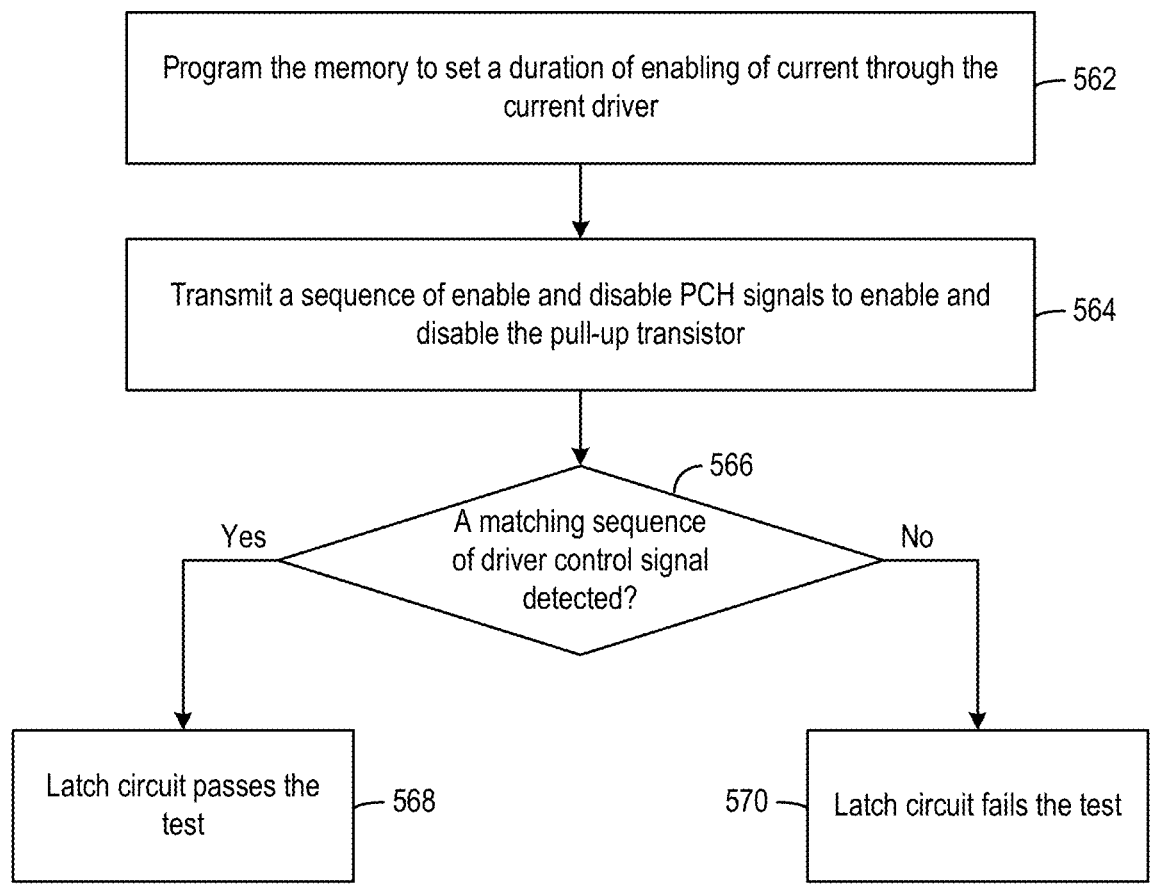

After testing memory 360 and comparator 362, internal test controller 440 can test latch circuit 364 and monitor the test output using monitor circuit 504. FIG. 5F illustrates an example test operation 560 that can be performed using monitor circuit 504 to test latch circuit 364.

In step 562, internal test controller 404 can program the memory 360 to store a target count value to set a duration of enabling of current through current driver circuit 332. In some examples, the target count value can correspond to the minimum duration (e.g., a value of one) to reduce the duration of test operation 560.

In step 564, internal test controller 440 can control display control circuit 303 to supply a sequence of global signal 309 including, for example, the PCH signal, the LATCH_CMP signal, and FBEN signal as described in FIG. 3D to comparator 362 and latch circuit 364. Internal test controller 440 can also enable monitor circuit 504 (e.g., by asserting the EN1 signal) to obtain driver control signal 336 ($v_{driver}$ of FIG. 5A).

In step 566, internal test controller 440 can determine whether a matching sequence of driver control signal 336 is detected. For example, referring back to FIG. 3D, internal test controller 440 can determine that driver control signal 336 is expected to change from a logical one to a logical zero at time T1 when FBEN is de-asserted, and that driver control signal 336 is expected to change from a logical zero to a logical one at time T2 when the input count value matches the target count value. Internal test controller 440 can determine whether the driver control signal 336 detected via monitor circuit 504 matches the expected sequence.

If internal test controller 440 determines that a matching sequence of driver control signal 336 is detected (in step 566), internal test controller 440 can indicate that latch circuit 364 passes the test, in step 568. But if a matching sequence is not detected (e.g., driver control signal 336 being stuck at logical one or logical zero throughout the test), internal test controller 440 can indicate that latch circuit 364 fails the test, in step 570. As explained above, if there is an open or a short anywhere in latch circuit 364, latch circuit 364 can no longer control the driver control signal 336 based on the comparator output, driver control signal 336 can also be stuck at a particular logic state. In such a case, the failure cannot be repaired/mitigated by the remapping logic, and the display unit/pixel can be determined to be defective and not operational.

Figure 6A:
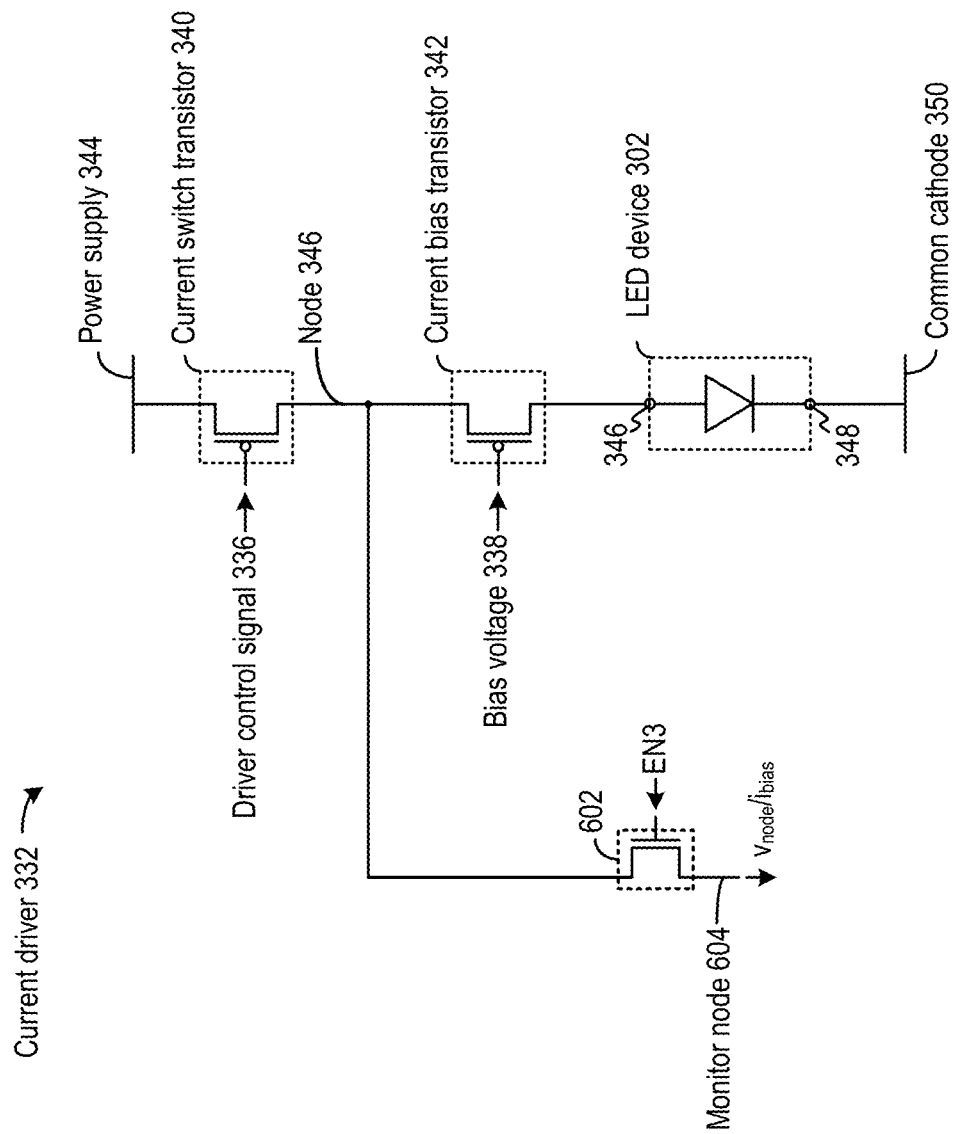
FIG. 6A, FIG. 6B, FIG. 6C, FIG. 6D, and FIG. 6E illustrate examples of test circuits for the example display apparatus of FIG. 3A-FIG. 3D and their operations, according to examples of the disclosed techniques.

FIG. 6A, FIG. 6B, FIG. 6C, FIG. 6D, and FIG. 6E illustrate example monitor circuits of current driver and various test operations supported by those monitor circuits. Referring to FIG. 6A, a monitor circuit 602, which may include a transistor configured as a pass-gate, can couple between node 347 of current driver circuit 332 and a monitor node 604. As to be described below, depending on a test configuration, monitor circuit 602 can be controlled by an EN2 signal to pass a voltage of node 347 the comparator output (labelled "$v_{node}$" in FIG. 6A) or a bias current (labelled "$i_{bias}$" in FIG. 6A). One advantage of coupling monitor circuit 602 with node 347 is that the voltage of node 347 can be significantly lower than power supply 374, which can reduce electrical stress on monitor circuit 602. As a result, devices with lower tolerance for electrical stress can be used to implement monitor circuit 602. Given that such devices are typically smaller, monitor circuit 602 can occupy a smaller area, which allows a monitor circuit 602 to be provided for each display unit in the backplane where space is premium.

Internal test controller 440 can then perform various unit-level tests on the current driver and LED of each display unit. The unit-level tests can be performed either when the LED (e.g., LED) is attached to the backplane and coupled between the current driver and the common cathode, or before the LED is attached to the backplane.

Figure 6B:
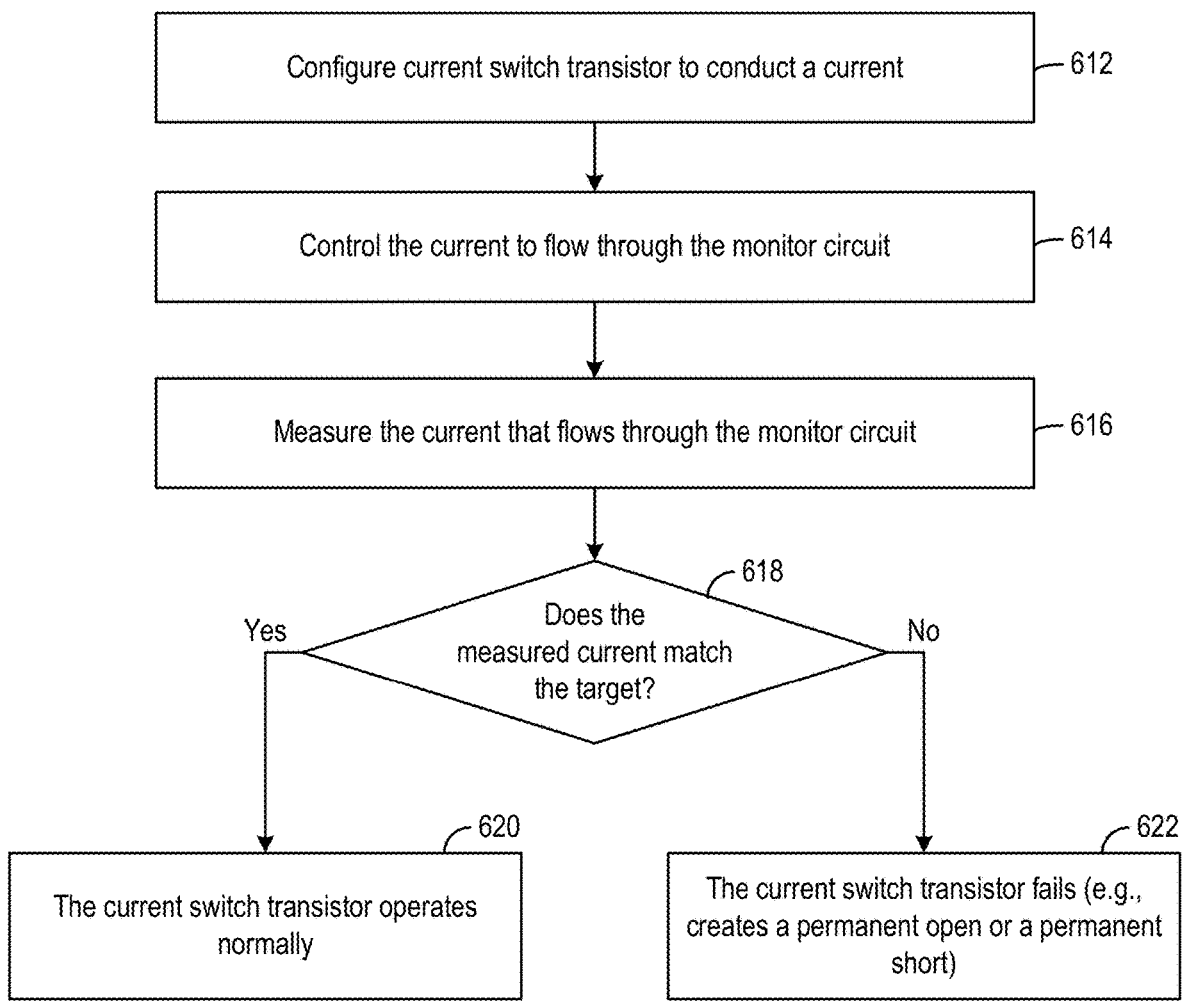

FIG. 6B illustrates an example test operation 610 that can be performed using monitor circuit 602 to test current switch transistor 340 of current driver circuit 332. Test operation 610 can be performed either before or after the LED is coupled with current driver circuit 332.

In step 612, internal test controller 404 can configure current switch transistor 340 to conduct a current. The configuration can be based on, for example, setting a voltage of power supply 344, programming memory 360 to set a duration of enabling of current through current switch transistor 340, controlling display control circuit 303 to supply a sequence of global signal 309 including, for example, the PCH signal, the LATCH_CMP signal, and FBEN signal as described in FIG. 3D to comparator 362 and latch circuit 364, etc. As a result of step 612, current switch transistor 340 can receive a driver control signal 336 configured to enable current switch transistor 340 to conduct a current for a certain duration.

In step 614, internal test controller 404 can control the current to flow through monitor circuit 602 to monitor node 604. The controlling can be based on, for example, asserting the EN3 signal. In addition, in a case where the LED is coupled between current driver circuit 332 and common cathode 350, internal test controller 404 can disable the current path through the LED based on, for example, setting the voltages of power supply 344 and common cathode 350 so that the LED is in a reverse bias state. Such arrangements can ensure that the current path through the LED can be largely disabled, so that most of the current through current switch transistor 340 can be collected and measured at monitor node 604.

In step 616, internal test controller 404 can measure the current that flows through monitor circuit 604. Various techniques can be employed to measure the current. For example, internal test controller 404 can include a resistor through which the current can flow, and internal test controller 404 can measure the current through the resistor based on measuring a voltage difference across the resistor.

In step 618, internal test controller 404 can determine whether the current matches a target current. The target current can be based on the voltage of power supply 344, or simply a non-zero threshold to test whether a current flows through current switch transistor 340 and monitor circuit 602.

If internal test controller 404 determines that the measured current matches a target current (step 618), internal test controller 404 can indicate that current switch transistor 340 operates normally, in step 620. But if internal test controller 404 determines that the measured current mismatches with the target current, internal test controller 404 can indicate that current switch transistor 340 fails, in step 622.

In a case where the measured current mismatches with the target current, internal test controller 404 can also determine the mode of failure (e.g., a permanent open or a permanent short) based on the mismatch. For example, if internal test controller 404 detects that no current flows through monitor circuit 602, internal test controller 404 can indicate that current switch transistor 340 creates a permanent open. On the other hand, if internal test controller 404 detects that a current flows through monitor circuit 602, but the current does not change with the voltage of supply 374 and/or that the current is not disabled based on driver control signal 336, internal test controller 404 can indicate that current switch transistor 340 creates a permanent short.

Figure 6C:
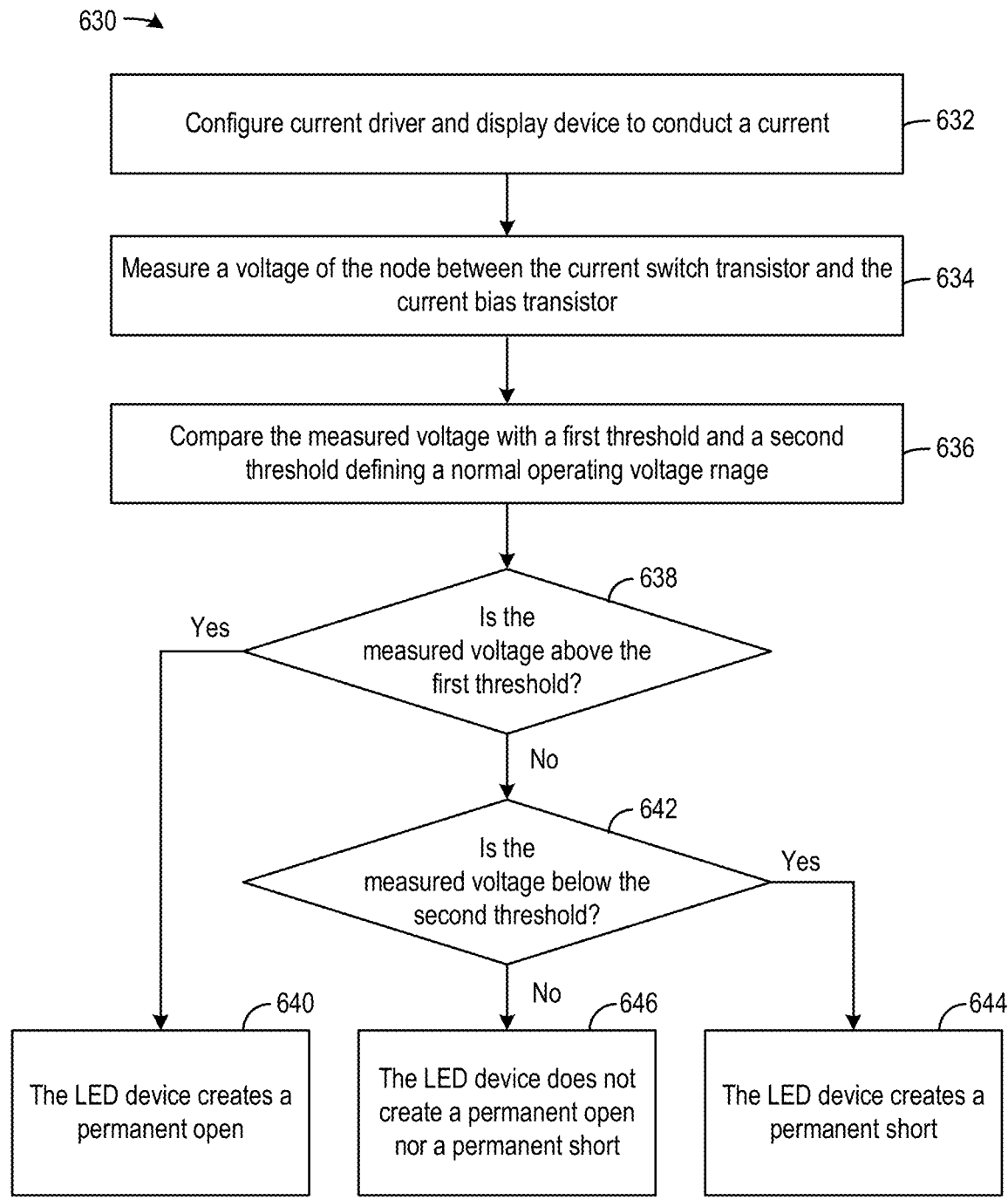

FIG. 6C illustrates an example test operation 630 that can be performed using monitor circuit 602 to test a LED of a display unit, such as LED 302 of display unit 320. If the LED creates a permanent open, the voltage of node 347 can be close to the voltage of power supply 344, whereas if the LED creates a permanent short, the voltage of node 347 can be close to the voltage of common cathode 350, which is typically a negative voltage. But if the LED operates normally, or at least not creating a permanent short/open, the voltage of node 347 can be near a middle between power supply 344 and common cathode 350.

In step 632, internal test controller 404 can configure current driver circuit 332 and LED 302 to conduct a current. The configuration can be based on, for example, setting a voltage of power supply 344, programming memory 360 to set a duration of enabling of current through current switch transistor 340, controlling display control circuit 303 to supply a sequence of global signal 309 including, for example, the PCH signal, the LATCH_CMP signal, and FBEN signal as described in FIG. 3D to comparator 362 and latch circuit 364, etc. In addition, internal test controller 404 can set a voltage of common cathode 350 such that LED 302 is in a forward-bias state.

In step 634, internal test controller 404 can measure a voltage of node 347 between current switch transistor 340 and current bias transistor 342 by, for example, asserting the EN3 signal.

In step 636, internal test controller 404 can compare the measured voltage against a first threshold and a second threshold. The first threshold and the second threshold can correspond to, respectively, an upper limit and a lower limit of a voltage range in which the LED can be determined as operating normally, or at least not creating a permanent open/short. In some examples, the first threshold can be based on the voltage of power supply 344 and a drain-source voltage of current switch transistor 340 to conduct a particular bias current, whereas the second threshold can be based on the voltage of common cathode 350 as well as a drain-source voltage of current bias transistor 342 to conduct that bias current.

In step 638, if internal test controller 404 determines that the measured voltage is above the first threshold, internal test controller 404 can indicate that the LED creates a permanent short, in step 640. Moreover, if internal test controller 404 determines that the measured voltage is below the second threshold, in step 642, internal test controller 404 can indicate that LED creates a permanent open, in step 644. But if internal test controller 404 determines that the measured voltage is between the first threshold and the second threshold, internal test controller can indicate that the LED does not create a permanent open nor a permanent short, in step 646.

Figure 6D:
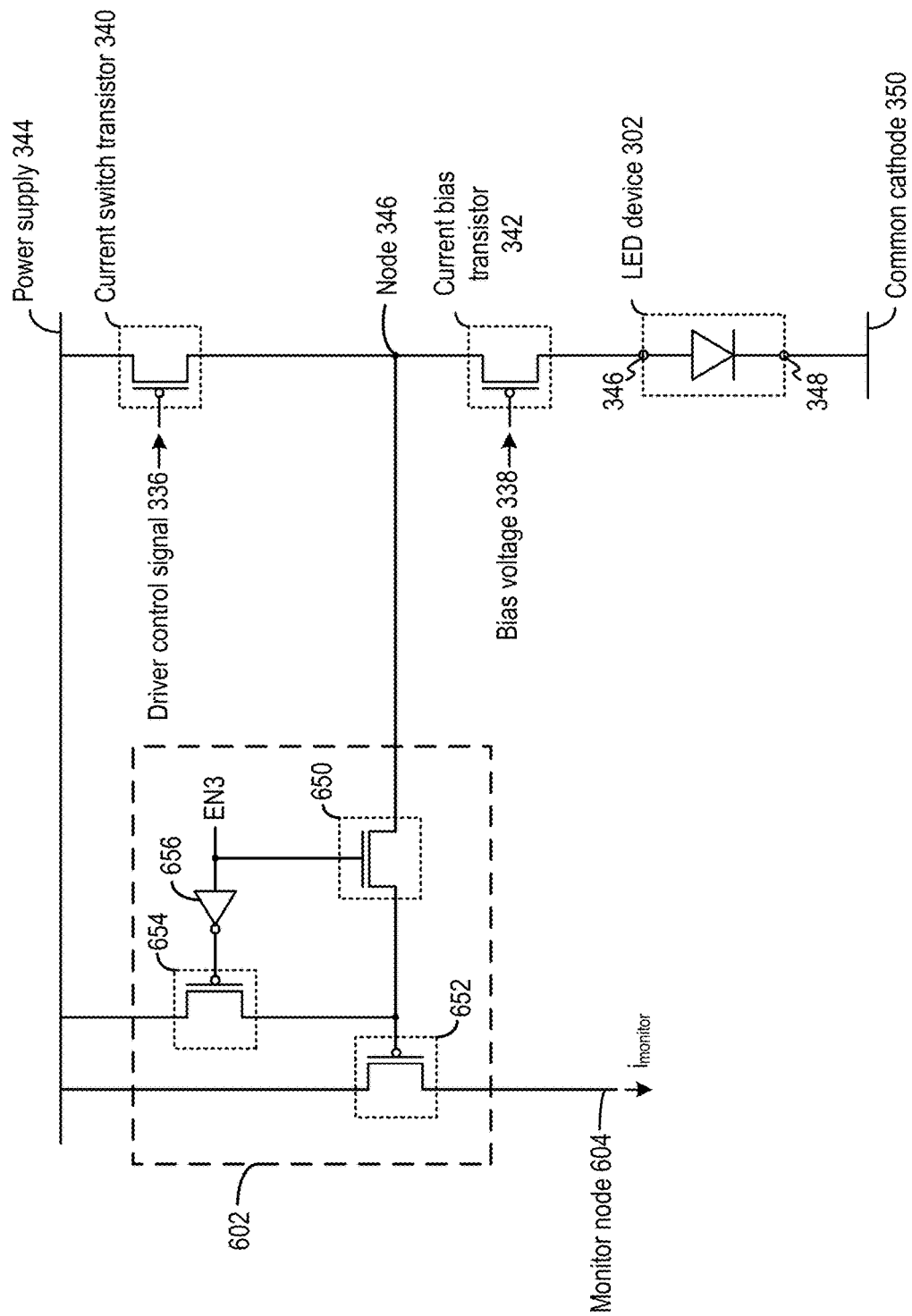

FIG. 6D illustrates another example of monitor circuit 602. In the example of FIG. 6D, monitor circuit 602 comprises a first transistor 650, a second transistor 652, and a third transistor 654. First transistor 650 is configured as pass-gate N-transistor to pass a voltage of node 347 to a gate of second transistor 652, which can be a P-transistor and configured as a current switch controlled by the voltage of node 347. Depending on the voltage of node 347, second transistor 652 may output a current $i_{mon}$, or no current, at monitor node 604. Specifically, if the voltage of node 347 is close to that of power supply 344, second transistor 652 can be turned off and no current can flow through second transistor 652 to monitor node 604. But if the voltage of node 347 is close to that of cathode 350, second transistor 652 can be turned on and a current can flow through second transistor 652 to monitor node 604. First transistor 650 and third transistor 654 can also enable or disable monitor circuit 602 based on the EN3 signal. When EN3 signal is de-asserted, first transistor 650 can be turned off, while third transistor 654 can be turned on by the inverted EN3 signal (from inverter 656) to pull the gate of second transistor 652 to the power supply voltage to disable second transistor 652.

Compared with the example monitor circuit 602 of FIG. 6A, the example of monitor circuit 602 of FIG. 6D can provide better insulation of current driver circuit 332 from the monitor circuit to reduce current leakage from current driver circuit 332 through monitor circuit 602. Specifically, in the example of FIG. 6A, current can leak through the pass-gate transistor of monitor circuit 602 to monitor node 604 even when the pass-gate transistor is disabled by the EN3 signal. In contrast, in the example of FIG. 6A, as first transistor 650 is coupled between current driver circuit 332 and the gate of second transistor 652, very little leakage current can flow from node 347 to the gate of second transistor 652. The reduction in the leakage current can improve the performance of current driver circuit 332.

The example monitor circuit 602 of FIG. 6D can support the aforementioned test operations, such as test operation 610 of current switch transistor 340. Specifically, as part of test operation 610, current switch transistor 340 can be tested when LED 302 is in a reverse bias state or not coupled with current driver circuit 332. If current switch transistor 340 creates a permanent open, node 347 that is not driven by current switch transistor 340 can have a low voltage (e.g., due to charge leakage). First transistor 650 can pass the low voltage of node 347 to enable second transistor 652, and a monitor current i monitor can flow through second transistor 652 to monitor node 604. On the other hand, if current switch transistor 340 conducts a current, node 347 can be pulled to the voltage of power supply 344. First transistor 650 can pass the high voltage of node 347 to disable second transistor 652, and no current can flow through second transistor 652 to monitor node 604. A permanent short at current switch transistor 340 can also be detected if no monitor current $i_{monitor}$ is detected even when current switch transistor 340 is disabled by the driver control signal 336. Accordingly, based on the detection of monitor current $i_{monitor}$ at monitor node 604, it can be determined whether current switch transistor 340 has a permanent open, a permanent short, or whether current switch transistor 340 operates normally.

The example monitor circuit 602 of FIG. 6D can also support test operation 630 of LED 302. Specifically, as part of test operation 630, LED 302 can be put in the forward-bias state to enable LED 302 to conduct a current. If LED 302 creates a permanent open, node 347 can be pulled to close to the voltage of power supply 344. First transistor 650 can pass the high voltage of node 347 to disable second transistor 652, and no current can flow through second transistor 652 to monitor node 604. On the other hand, if LED 302 creates a permanent short, node 347 can be pulled close to the voltage of common cathode 350. First transistor 650 can pass the low voltage of node 347 to enable second transistor 652, and a monitor current $i_{monitor}$ can flow through second transistor 652 to monitor node 604. Accordingly, based on the detection or non-detection of monitor current $i_{monitor}$ at monitor node 604, it can also be determined whether LED 302 has a permanent open or a permanent short.

Figure 6E:
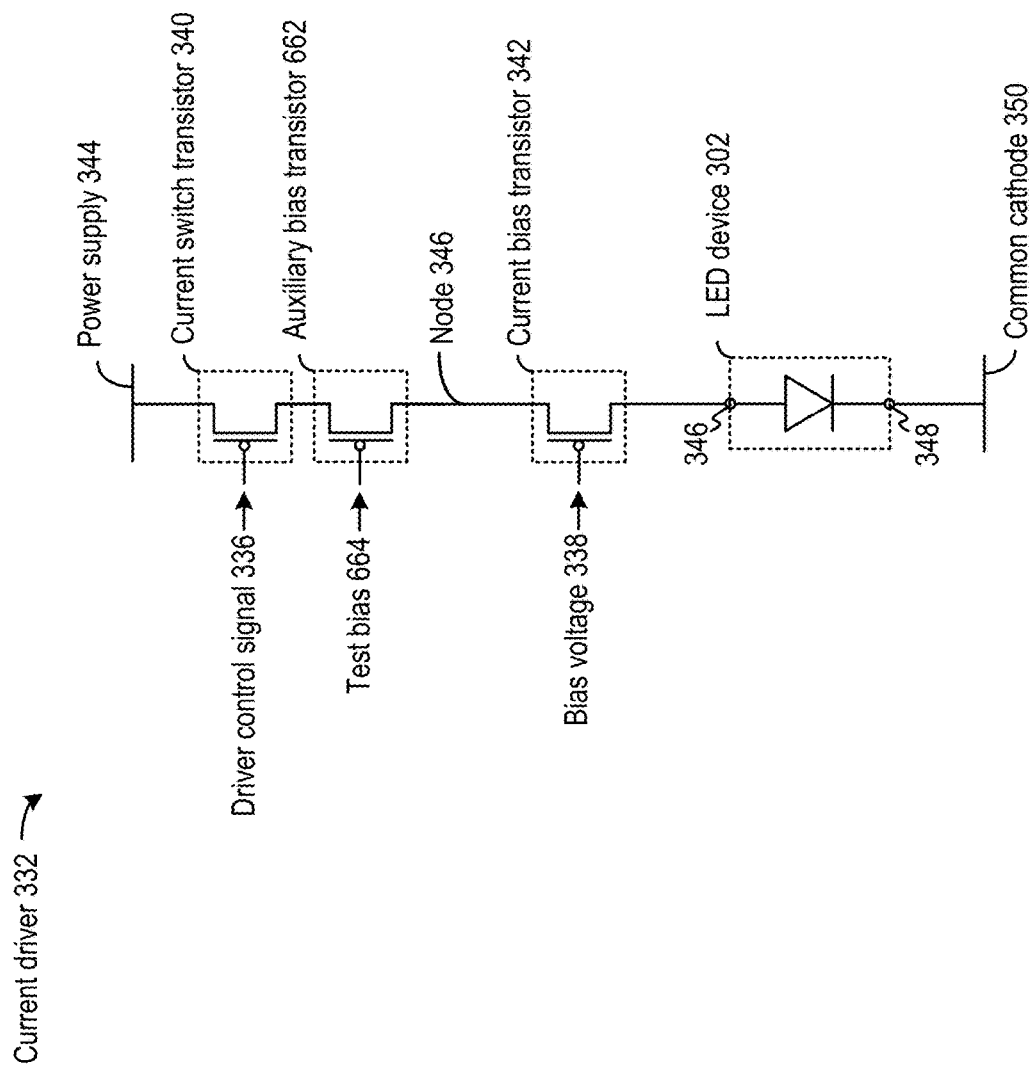

FIG. 6E illustrates another example of test circuit that can be part of current driver circuit 332. As shown in FIG. 6E, current driver circuit 332 may include an auxiliary current bias transistor 662, which can receive a test bias signal 664 from internal test controller 404. Auxiliary current bias transistor 662 allows independent control of bias current through current driver circuit 332 and LED 302 for different display units. Such arrangements allow independent characterization of each LED 302. Specifically, internal test controller 404 can generate a set of test bias control signals 664 for a specific display unit to create different target bias currents for that display unit. The intensities of light output by the LED of that display unit can then be measured for the different target bias currents. A relationship between the output light intensities and the target bias currents can then be determined as part of characterization of the LED. Although not shown in FIG. 6E, it is understood the current driver circuit 332 of FIG. 6E can include a monitor circuit 602 as shown in FIG. 6A or FIG. 6D coupled with node 347 to support test operations 610 and, for example, current switch transistor 340, auxiliary bias transistor 662, LED 302, etc.

Figure 7A:
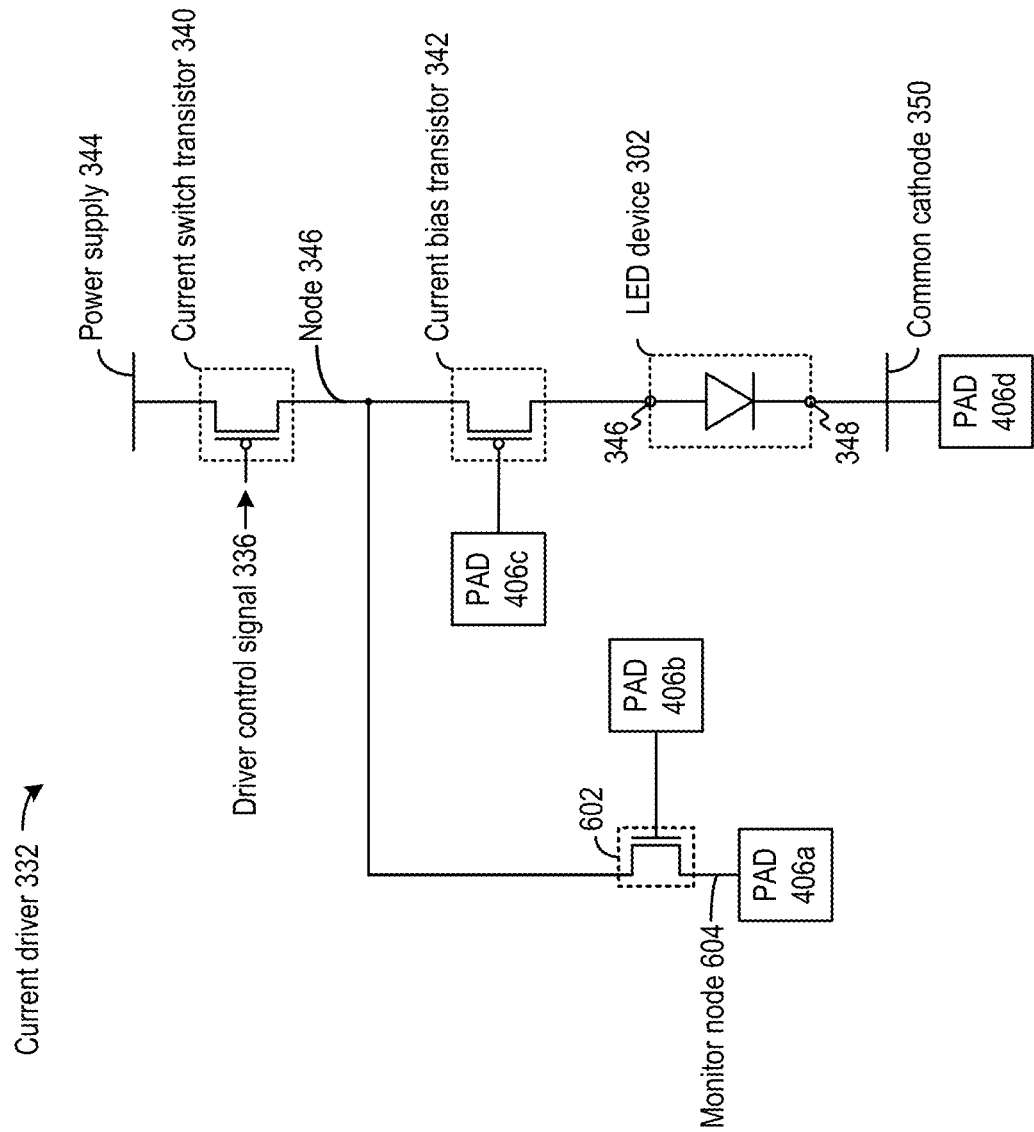
FIG. 7A, FIG. 7B, FIG. 7C, FIG. 7D, and FIG. 7E illustrate examples of pixel-level test circuits for the example display apparatus of FIG. 3A-FIG. 3D and their operations, according to examples of the disclosed techniques.
Figure 7B:
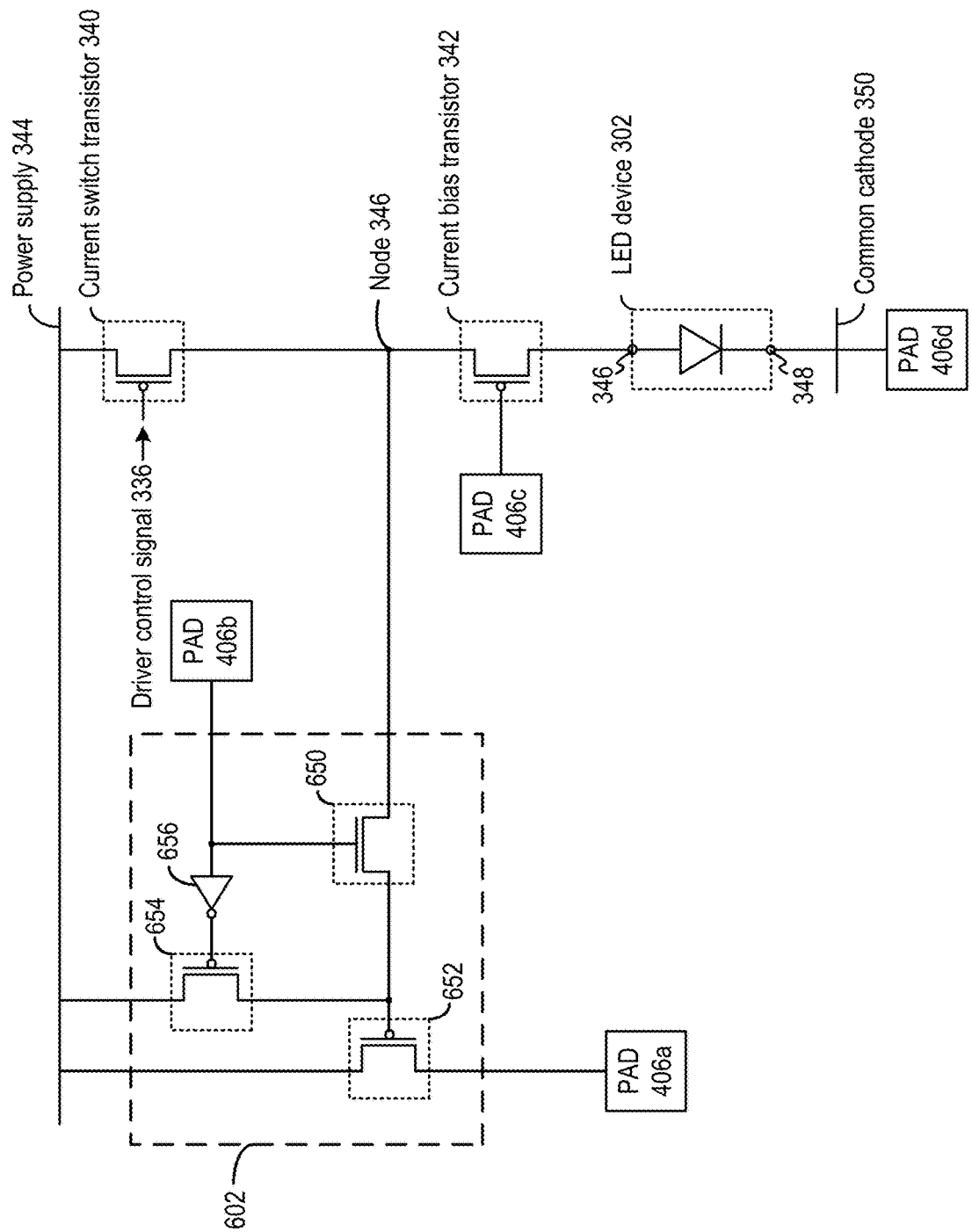

The example monitor circuit 602 of current driver circuit 332, including the examples illustrated in FIG. 6A and in FIG. 6D, can be accessible via test pads 406 formed on backplane 204 to support a global light-on test. Test pads 406 can be selectively coupled with current driver circuit 332 via multiplexor 408. FIG. 7A and FIG. 7B illustrate examples of connection of test pads 406 to current driver circuit 332. As shown in FIG. 7A and FIG. 7B, with the example monitor circuit 602 of FIG. 6A, test pad 406a can be coupled with monitor node 604, test pad 406b can be coupled with the control terminal of monitor circuit 602 to supply the EN3 signal, test pad 406c can be coupled with current bias transistor 342, whereas test pad 406d can be coupled with common cathode 350.

As part of the global light-on test, each of test pads 406a, 406b, 406c, and 406d can be coupled with an external test generator. Test pad 406a can be coupled with a current source to inject a current into monitor circuit 602. Test pads 406b and 406c can be coupled with voltage sources to fully enable monitor circuit 602 and current bias transistor 342 to allow the current to flow through monitor circuit 602 and current bias transistor 342 to reach LED 302. Test pad 406d can be coupled with a current sink to drain away the current from LED 302. Test pads 406a and 406d can also be coupled with voltage sources to set the voltages of monitor node 604 and common cathode 350 to set LED 302 in a forward bias state. It is then determined whether LED 302 outputs light in response to the current. If LED 302 outputs light of the expected intensity, it can be determined that LED 302 passes the light-on test, otherwise LED 302 can be determined to fail the light-on test.

Test pads 406a-406d of a group of display units can be coupled with a set of shared test pads on backplane 204, so that each of the group of display units receives the same set of bias voltages and share an input current from the external test generator. As a result of the global light-on test, it can then be determined which display unit(s) within the group fail to output light and fail the light-on test. In some examples, test operation 630 of FIG. 6C can be performed on display units that fail the global light-on test to identify the root-cause of the failure (e.g., due to a permanent short or a permanent open).

Figure 7C:
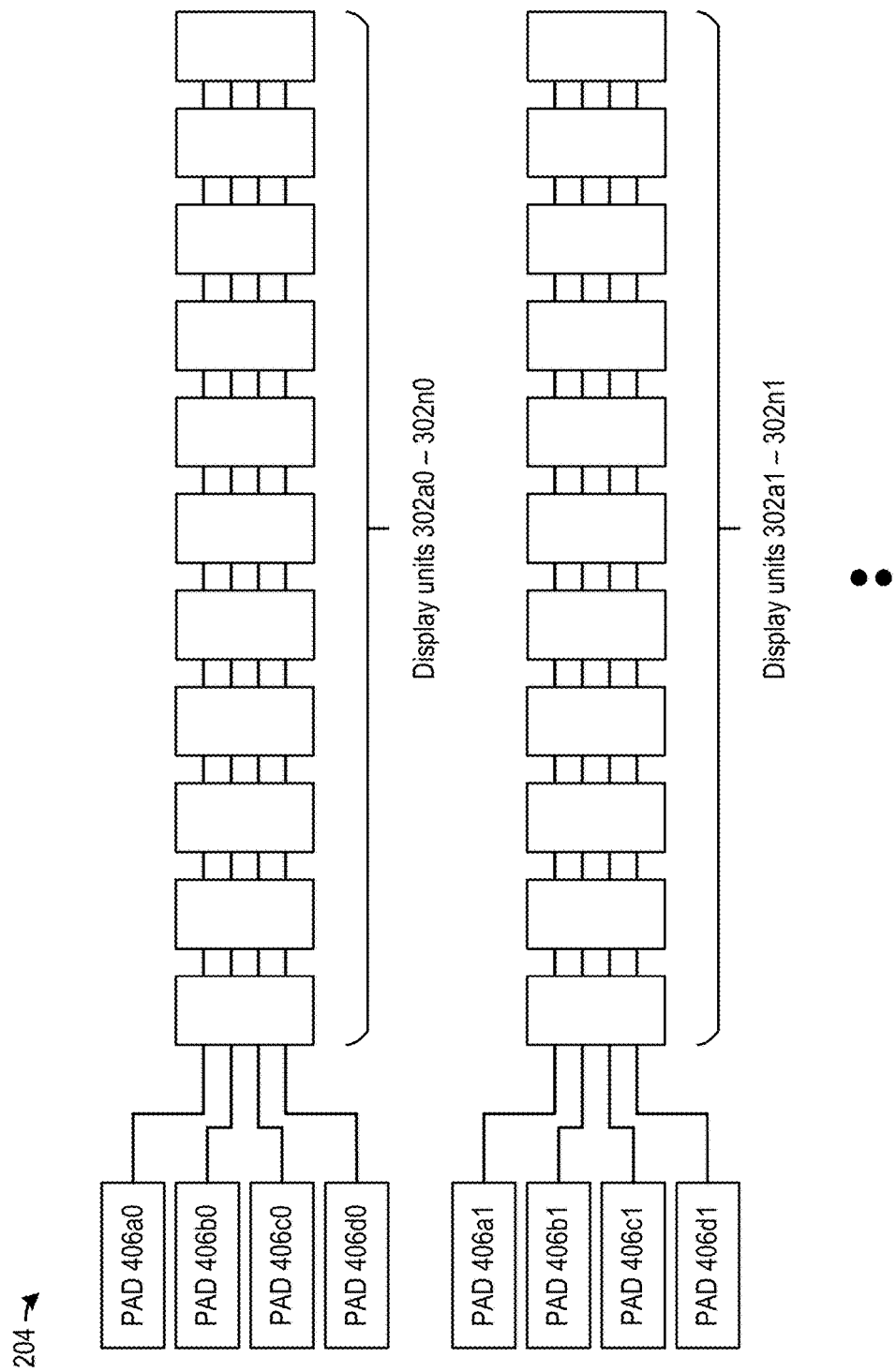

There are different ways by which the display units are grouped. For example, as shown in FIG. 7C, one row of display units can share four test pads. For example, a row of display units 302a0-302n0 on backplane 204 can share test pad 406a0 (coupled with test pad 406a of each display unit within the row), test pad 406b0 (coupled with test pad 406b of each display unit within the row), test pad 406c0 (coupled with test pad 406c of each display unit within the row), and test pad 406d0 (coupled with test pad 406d of each display unit within the row). Moreover, a row of display units 302a1-302n0 can share test pads 406a1, 406b1, 406c1, and 406d1. As part of the global light-on test, it can be determined which display unit(s) within each row fail to turn on when the external test generator supplies the bias voltage and current to each row.

Figure 7D:
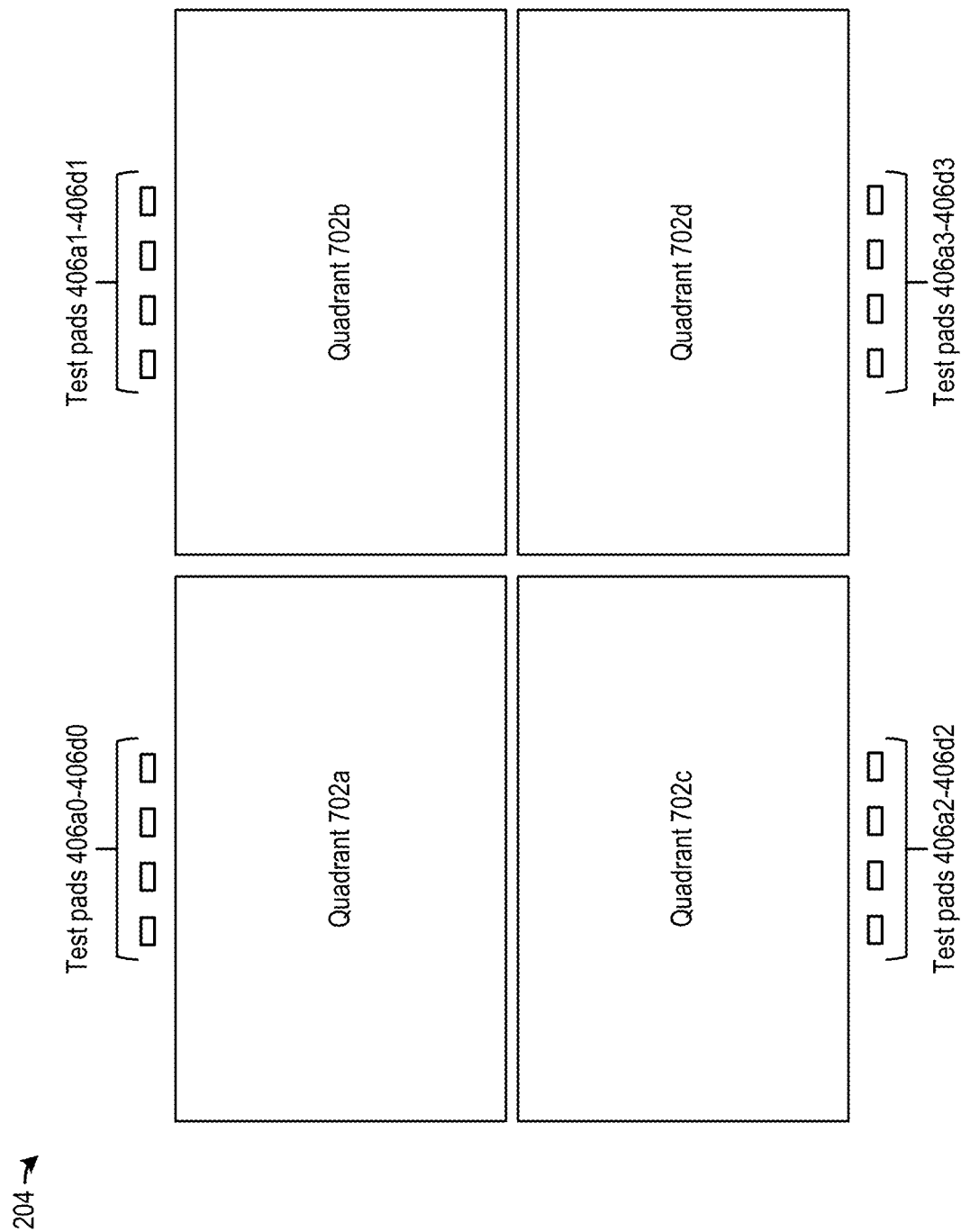

As another example, as shown in FIG. 7D, the display units on backplane 204 can be divided into quadrants 702a, 702b, 702c, and 702d. Each quadrant of display units can share a set of test pads. For example, the display units of quadrant 702a share test pads 406a0, 406b0, 406c0, and 406d0. The display units of quadrant 702b share test pads 406a1, 406b1, 406c1, and 406d1. Moreover, the display units of quadrant 702c share test pads 406a2, 406b2, 406c2, and 406d2. Further, the display units of quadrant 702d share test pads 406a3, 406b3, 406c3, and 406d3. As part of the global light-on test, it can be determined which display unit(s) within each quadrant fail to turn on when the external test generator supplies the bias voltage and current to each quadrant.

Figure 7E:
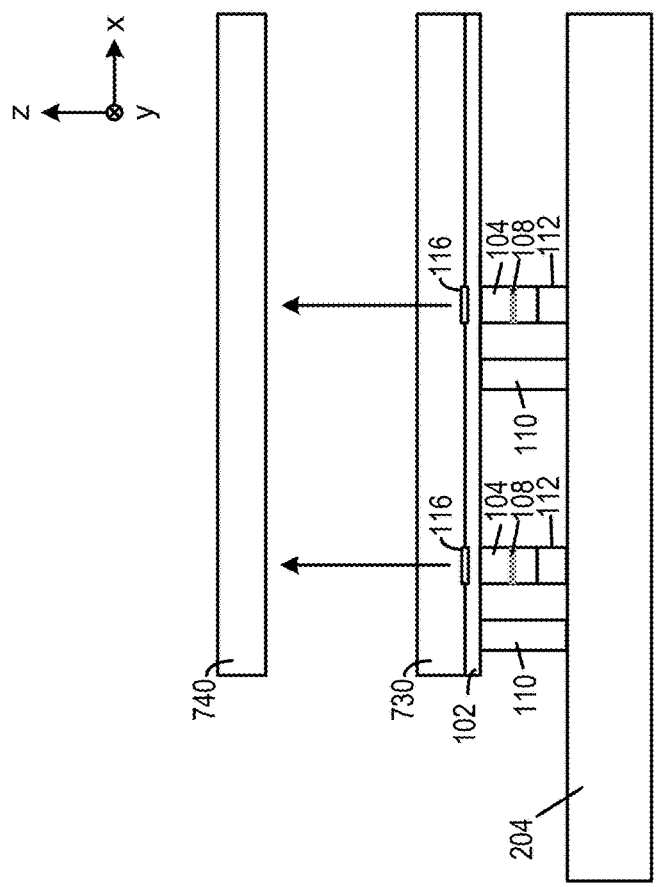
Figure 7E:
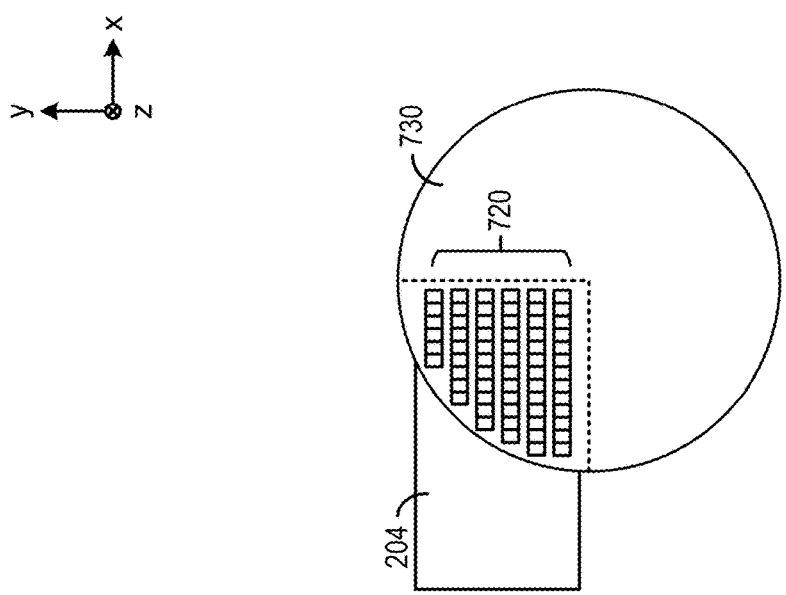

The global light-on test can be performed on a wafer during the fabrication of the LED devices, or after the LED devices are fabricated on the wafer. FIG. 7E illustrates an example of a global light-on test performed on a wafer, which may include pre-fabricated LED devices or incomplete LED devices. The left of FIG. 7E illustrates the test set-up from a top view whereas the right of FIG. 7E illustrates the test set-up from a side. As part of the global light-on test, the partially-formed LED devices 720 on a wafer 730 including substrate 102, epitaxial layer 104, light emitting layer 108, as well as contact pads 110 and 112, but without mesa 106, can be brought into electrical contact with backplane 204 to couple with current driver circuit 332 and monitor circuit 602 of the display units, to receive bias voltage and current.

As part of the test up, a light sensor array 740 can be put over wafer 730 and facing the light emitting surface 116 of each of the LEDs under test. Each sensor element of light sensor array 740 can correspond to an LED under test. Based on the output of light sensor array 740, a determination can be made about whether any of the LEDs under test fails to output light (e.g., becoming a dark pixel). The test result can provide an indication of, for example, a yield of wafer 730. If the yield of the wafer is too low, and the fabrication of the LEDs on that wafer is not yet complete, the fabrication process can be suspended (e.g., the mesa formation step can be skipped), to reduce the time and resource spent on a failed wafer. The failure of the LEDs can also be root-caused to improve the future fabrication process of the LEDs.

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times to refer to these arrangements of operations as modules, without loss of generality. The described operations and their associated modules may be embodied in software, firmware, and/or hardware.

Steps, operations, or processes described may be performed or implemented with one or more hardware or software modules, alone or in combination with other devices. In some embodiments, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations described. The apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

The invention claimed is:

1. An apparatus comprising:
   a backplane to attach an array of light emitting diodes (LED), the backplane comprising an array of display driver circuits, each display driver circuit of the array of display driver circuits corresponding to an LED of the array of LEDs and comprising:
   a current driver circuit configured to supply a current to the corresponding LED, wherein the current driver circuit comprises a current switch transistor and a current bias transistor coupled in series at a first node, and the current switch transistor is coupled between a power supply and the first node and controllable by a driver control signal to enable or disable the current, the current bias transistor is coupled between the first node and a first terminal to receive an anode of the LED and configured to control a magnitude of the current based on a bias signal;
   the current bias transistor is coupled between the first node and a first terminal to receive an anode of the LED and configured to control a magnitude of the current based on a bias signal;
   a control signal generator circuit configured to supply a driver control signal to the current driver circuit to control the current; and
   one or more monitor circuits controllable to provide access to at least one of: the current, or an internal voltage of at least one of the current driver circuit or the control signal generator circuit.

2. The apparatus of claim 1, wherein the backplane further comprises an internal test controller configured to control the one or more monitor circuits of each display driver circuit.

3. The apparatus of claim 2,
   wherein the control signal generator circuit comprises:
   a comparator having a comparator output node; and
   a latch circuit coupled with the comparator output node and configured to generate the driver control signal; and
   wherein the one or more monitor circuits comprises a first monitor circuit coupled with the comparator output node and a second monitor circuit coupled with a feedback node of the latch circuit.

4. The apparatus of claim 3, wherein:
   the control signal generator circuit further comprises a memory, a pull-up transistor, and a plurality of pull-down branches;
   each of the pull-up transistor and the pull-down branches is coupled at the comparator output node;
   each of the pull-down branches is coupled with a memory bit of the memory and an input value bit of a counter;
   the pull-up transistor is configured to couple the comparator output node with a power supply when enabled by a pre-charge (PCH) enable signal, and to de-couple the comparator output node from the power supply when disabled by a PCH disable signal; and
   each of the pull-down branches is configured to couple the comparator output node with a ground when enabled by a combination of the respective memory bit of the memory and the input value bit of the counter, and to de-couple the comparator output node from the ground when disabled by at least one of the respective memory bit or the input value bit.

5. The apparatus of claim 4, wherein the internal test controller is configured to:
   store a first value in the memory to disable each of the pull-down branches;
   transmit a sequence of the PCH enable and disable signals to, respectively, enable and disable the pull-up transistor;
   obtain, via the first monitor circuit, a voltage of the comparator output node when transmitting the sequence of the PCH enable and disable signals;
   determine whether the voltage of the comparator output node follows the sequence of the PCH enable and disable signals; and
   output an indication of whether the pull-up transistor operates normally based on the determination.

6. The apparatus of claim 5, wherein the internal test controller is configured to:
   output a first indication that the pull-up transistor operates normally based on determining that the voltage of the comparator output node follows the sequence of the PCH enable and disable signals;
   output a second indication that the comparator fails based on determining that the voltage of the comparator output node remains at a logical zero when the sequence of the PCH enable and disable signals is transmitted; and
   output a third indication that the pull-up transistor creates a permanent electrical open based on determining that the voltage of the comparator output node remains at a logical one when the sequence of the PCH enable and disable signals is transmitted.

7. The apparatus of claim 4, wherein the internal test controller is configured to:
   transmit a PCH enable signal to the pull-up transistor;
   store a second value in the memory to enable each pull-down branch of the plurality of pull-down branches when the pull-down branch receives the input value bit from the counter that matches the memory bit coupled with the pull-down branch;

start the counter to supply a set of input values sequentially to the plurality of pull-down branches;
obtain, via the first monitor circuit, a voltage of the comparator output node when the counter supplies the set of input values to the plurality of pull-down branches;
determine, based on the voltage, whether a pull-down branch fails to pull down the comparator output node when the input value bit and the memory bit matches for the pull-down branch; and
output a fourth indication of whether any one of the plurality of pull-down branches creates a permanent electrical open based on the determination.

8. The apparatus of claim 7, further comprising a remapping logic configured to map the memory bits of the memory and the input value bits of the counter to the plurality of pull-down branches,
wherein the remapping logic is configured, based on the fourth indication, to map a least significant memory bit of the memory and a least significant input value bit of the counter to one of the plurality of pull-down branches determined by the internal test controller as creating a permanent electrical open.

9. The apparatus of claim 7, wherein the internal test controller is configured to:
obtain, via the second monitor circuit, a voltage of the feedback node of the latch circuit when the counter supplies the set of input values to the plurality of pull-down branches;
determine whether the voltage of the feedback node changes; and
output a fifth indication of whether the latch circuit operates normally based on whether the voltage of the feedback node changes.

10. The apparatus of claim 9, wherein the latch circuit is configured to output the driver control signal at the feedback node.

11. The apparatus of claim 2, wherein:
the backplane further comprises a common cathode to receive a cathode of each of the array of LEDs; and
the one or more monitor circuits comprises a first monitor circuit coupled between the first node and a monitor node.

12. The apparatus of claim 11, wherein the internal test controller is configured to:
control the control signal generator circuit to transmit a first driver control signal to enable the current switch transistor;
control the first monitor circuit to provide a current path to conduct the current to the monitor node;
measure the current at the monitor node; and
output a sixth indication of whether the current switch transistor operates normally based on the measured current at the monitor node.

13. The apparatus of claim 12, wherein the internal test controller is configured to:
modulate a voltage of the power supply;
determine whether the measured current changes in response to the modulation of the voltage; and
in response to determining that the measured current does not change, output the sixth indication that the current switch transistor creates a permanent electrical short.

14. The apparatus of claim 13, wherein the internal test controller is configured to, in response to determining no current is measured at the monitor node, output the sixth indication that the current switch transistor creates a permanent electrical open.

15. The apparatus of claim 12, wherein the internal test controller is configured to, when the LED of a display unit is coupled between the current bias transistor of the display unit and the common cathode:
control the control signal generator circuit to transmit a first driver control signal to enable the current switch transistor;
provide the bias signal to the current bias transistor;
set a first voltage and a second voltage of, respectively, the power supply and the common cathode to put the LED in a forward bias state;
obtain, from the first monitor circuit, a voltage of the first node;
compare the voltage of the first node against a first threshold and a second threshold, the first threshold being higher than the second threshold;
in response to determining that the voltage of the first node is above the first threshold, output the sixth indication that the LED creates a permanent electrical open; and
in response to determining that the voltage of the first node is below the second threshold, output the sixth indication that the LED creates a permanent electrical short.

16. The apparatus of claim 11, wherein:
the first monitor circuit comprises a first transistor configured as a pass-gate and a second transistor configured as an amplifier;
the first transistor is coupled between the first node and a gate of the second transistor; and
the second transistor is coupled between the power supply and the monitor node.

17. The apparatus of claim 11, wherein:
the backplane further comprises a first test pad, a second test pad, a third test pad, a fourth test pad, and a multiplexor circuit, the first test pad, the second test pad, the third test pad, and the fourth test pad being accessible to an external test controller;
the first test pad is selectively coupled with the monitor node of the current driver circuit of a group of display driver circuits via the multiplexor circuit;
the second test pad is selectively coupled with a control node of the first third monitor circuit of the group of display driver circuits via the multiplexor circuit;
the third test pad is selectively coupled with a gate of the current bias transistor of the group of display driver circuits via the multiplexor circuit; and
the fourth test pad is selectively coupled with the common cathode.

18. The apparatus of claim 17, wherein the external test controller is configured to, when the group of display driver circuits of the backplane is coupled with a plurality of LED devices on a wafer:
connect a current source across the first test pad and the fourth test pad to inject a bias current and to provide a return path for the bias current;
set first voltages at the second test pad and the third test pad to enable the first monitor circuit and the current bias transistor to transmit the bias current to the plurality of LED devices on the wafer; and
set second voltages at the first test pad and the fourth test pad to set the plurality of LED devices in a forward bias state; and
wherein a light emitting surface of each of the plurality of LED devices on the wafer is positioned towards a light sensor array to enable a determination of which of the plurality of LED devices fails to output light.

19. A method comprising:
supplying a current via a current switch transistor and a current bias transistor to a light emitting diode (LED), wherein the current switch transistor and the current bias transistor is part of a display driver circuit in a backplane on which the LED is attached, and where the current switch transistor, the current bias transistor, and the LED are connected in series;
outputting a bias signal to the current bias transistor to control a magnitude of the current;
measuring, via a monitor circuit of the backplane, a voltage of a node between the current switch transistor and the current bias transistor;
comparing the measured voltage with a first threshold and a second threshold defining a normal operating voltage range of the LED;
based on whether the measured voltage is above the first threshold and whether the measured voltage is below the second threshold, outputting one of:
a first indication that the LED creates a permanent open;
a second indication that the LED creates a permanent short; or
a third indication that the LED does not create a permanent open nor a permanent short.

20. A non-transitory computer readable medium comprising instructions that, when executed by a hardware processor of a test controller, causes the hardware processor to:
supply a current via a current switch transistor and a current bias transistor to a light emitting diode (LED), wherein the current switch transistor and the current bias transistor is part of a display driver circuit in a backplane on which the LED is attached, and where the current switch transistor, the current bias transistor, and the LED are connected in series;
output a bias signal to the current bias transistor to control a magnitude of the current;
measure, via a monitor circuit of the backplane, a voltage of a node between the current switch transistor and the current bias transistor;
compare the measured voltage with a first threshold and a second threshold defining a normal operating voltage range of the LED;
based on whether the measured voltage is above the first threshold and whether the measured voltage is below the second threshold, output one of:
a first indication that the LED creates a permanent open;
a second indication that the LED creates a permanent short; or
a third indication that the LED does not create a permanent open nor a permanent short.

* * * * *